(12) United States Patent
No et al.

(10) Patent No.: US 9,690,654 B2
(45) Date of Patent: Jun. 27, 2017

(54) OPERATION METHOD OF NONVOLATILE MEMORY SYSTEM

(71) Applicants: Hyery No, Seoul (KR); Sangkwon Moon, Osan-si (KR); Suejin Kim, Bucheon-si (KR); Heewon Lee, Suwon-si (KR)

(72) Inventors: Hyery No, Seoul (KR); Sangkwon Moon, Osan-si (KR); Suejin Kim, Bucheon-si (KR); Heewon Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 43 days.

(21) Appl. No.: 14/979,971

(22) Filed: Dec. 28, 2015

(65) Prior Publication Data
US 2016/0203047 A1    Jul. 14, 2016

(30) Foreign Application Priority Data
Jan. 13, 2015    (KR) .................. 10-2015-0006033

(51) Int. Cl.
*G11C 29/00*    (2006.01)
*G06F 11/10*    (2006.01)
(Continued)

(52) U.S. Cl.
CPC ........ *G06F 11/1068* (2013.01); *G06F 3/0604* (2013.01); *G06F 3/064* (2013.01);
(Continued)

(58) Field of Classification Search
CPC .. G06F 11/1068; G06F 3/0604; G06F 3/0619; G06F 3/064; G06F 3/0679; G06F 11/1048
See application file for complete search history.

(56) References Cited

U.S. PATENT DOCUMENTS

| 5,818,762 A | 10/1998 | Maari et al. |
| 7,679,133 B2 | 3/2010 | Son et al. |

(Continued)

FOREIGN PATENT DOCUMENTS

| JP | 08-147988 A | 6/1996 |
| JP | 2001-318829 A | 11/2001 |

(Continued)

*Primary Examiner* — David Ton
(74) *Attorney, Agent, or Firm* — Volentine & Whitt, PLLC

(57) ABSTRACT

A nonvolatile memory system includes a nonvolatile memory device and a memory controller managing the nonvolatile memory device. The operation method includes receiving a read command and a read address from an external device, reading read data stored in memory cells connected to a selected word line of a selected memory block corresponding to the read address in response to the read command, and detecting and correcting error bits of the read data. The method includes estimating the number of error bits of unselected word lines on the basis of erase leaving times of memory cells connected to the unselected word lines of the selected memory block and the detected error bits, and performing read-reclaim operation on at least one word line among the selected word line and the unselected word lines on the basis of the estimated number of error bits.

20 Claims, 20 Drawing Sheets

(51) Int. Cl.
*G06F 3/06* (2006.01)
*G11C 29/52* (2006.01)
*G11C 29/42* (2006.01)
*G11C 11/56* (2006.01)

(52) U.S. Cl.
CPC .......... *G06F 3/0619* (2013.01); *G06F 3/0679* (2013.01); *G06F 11/1048* (2013.01); *G11C 29/42* (2013.01); *G11C 29/52* (2013.01); *G11C 11/5642* (2013.01)

(56) References Cited

U.S. PATENT DOCUMENTS

| | | | |
|---|---|---|---|
| 7,859,932 B2 | 12/2010 | Mokhlesi | |
| 8,028,121 B2 | 9/2011 | Jeong | |
| 8,040,744 B2 | 10/2011 | Gorobets et al. | |
| 8,078,923 B2 | 12/2011 | Nagadomi et al. | |
| 8,255,762 B2 | 8/2012 | Nagadomi et al. | |
| 8,261,136 B2 | 9/2012 | D'Abreu et al. | |
| 8,356,152 B2 | 1/2013 | You | |
| 8,553,466 B2 | 10/2013 | Han et al. | |
| 8,559,235 B2 | 10/2013 | Yoon et al. | |
| 8,650,353 B2 | 2/2014 | Belgal et al. | |
| 8,654,587 B2 | 2/2014 | Yoon et al. | |
| 8,670,285 B2 | 3/2014 | Dong et al. | |
| 8,681,554 B2 | 3/2014 | Suzuki | |
| 8,689,082 B2 | 4/2014 | Oh et al. | |
| 8,756,474 B2 | 6/2014 | Shibata et al. | |
| 2009/0327581 A1 | 12/2009 | Coulson | |
| 2010/0138588 A1 | 6/2010 | Lin et al. | |
| 2010/0208521 A1* | 8/2010 | Kim | G11C 16/26 365/185.09 |
| 2010/0217919 A1 | 8/2010 | Sukegawa et al. | |
| 2011/0233648 A1 | 9/2011 | Seol et al. | |
| 2012/0051133 A1 | 3/2012 | Kanda | |
| 2012/0278533 A1 | 11/2012 | Suzuki et al. | |
| 2016/0055917 A1* | 2/2016 | Lee | G11C 16/34 365/185.11 |

FOREIGN PATENT DOCUMENTS

| | | |
|---|---|---|
| JP | 2002-318729 A | 10/2002 |
| JP | 2010-224874 A | 10/2010 |
| JP | 2012-022618 A | 2/2012 |
| JP | 2013-200919 A | 10/2013 |
| KR | 100764748 B1 | 10/2007 |

* cited by examiner

OPERATION METHOD OF NONVOLATILE MEMORY SYSTEM

CROSS-REFERENCE TO RELATED APPLICATIONS

This U.S. non-provisional patent application claims priority under 35 U.S.C. §119 of Korean Patent Application No. 10-2015-0006033, filed on Jan. 13, 2015, the entire contents of which are hereby incorporated by reference.

BACKGROUND

Semiconductor memory devices are memory devices implemented using a semiconductor such as silicon (Si), germanium (Ge), gallium arsenide (GaAs), and indium phosphide (InP). In general, semiconductor memory devices may be classified into volatile memory devices and nonvolatile memory devices.

Volatile memory devices lose their stored data when their power supplies are interrupted. Nonvolatile memory devices may include a static RAM (SRAM), a dynamic RAM (DRAM), and a synchronous DRAM (SDRAM). Nonvolatile memory devices are memory devices that retain their stored data even when their power supplies are interrupted. Nonvolatile memory devices may include a read only memory (ROM), a programmable ROM (PROM), an electrically programmable ROM (EPROM), an electrically erasable and programmable ROM (EEPROM), a flash memory device, a phase change RAM (PRAM), a magnetic RAM (MRAM), a resistive RAM (ReRAM), and a ferroelectric RAM (FRAM).

Flash memory device is being used in various fields because of advantages of a low noise, a high capacity, etc. A flash memory device may include memory devices such as a floating gate memory cell, a charge trap flash memory cell, etc. Memory cells of the flash memory device store data by changing threshold voltages of the memory cells. However, threshold voltages of the memory cells may be changed due to a physical characteristic of the memory cell or an external factor (e.g., temperature, time, etc.). In this case, stored data of the memory cells may be deteriorated and thereby affect reliability of the memory cell or the data. Recently, a memory controller has been introduced that manages various information (e.g., temperature, time, the number of times data is written, the number of times data is read and the number of times of program erase cycles), and various error correction methods and data management methods for addressing the reliability problem described above are being developed based on the information being managed.

SUMMARY

The inventive concept relates to a semiconductor memory, and more particularly, to an operation method of a nonvolatile memory system.

Example embodiments of the inventive concept provide an operation method of a nonvolatile memory system including a nonvolatile memory device and a memory controller managing the nonvolatile memory device. The operation method includes receiving a read command and a read address from an external device, reading read data stored in memory cells connected to a selected word line of a selected memory block corresponding to the read address in response to the read command, detecting and correcting error bits of the read data, estimating the number of error bits of unselected word lines on the basis of erase leaving times of memory cells connected to the unselected word lines of the selected memory block and the detected error bits, and performing a read-reclaim operation on at least one word line among the selected word line and the unselected word lines on the basis of the estimated number of error bits. The elapsed time after an erase is referred to herein as an erase leaving time (ELT).

Example embodiments of the inventive concept provide an operation method of a nonvolatile memory system including a nonvolatile memory device and a memory controller managing the nonvolatile memory device. The operation method includes receiving a read command and a read address from an external device, reading read data stored in memory cells connected to a selected word line of a selected memory block corresponding to the read address in response to the read command, detecting and correcting an error bit of the read data, counting the read command, in the case that the counting value reaches a random value, performing a dummy read operation on any one word line among unselected word lines of the selected memory block to detect the number of error bits of the one word line, and comparing a reclaim reference value depending on an erase leaving time of memory cells of the one word line or the selected memory block with the detected number of error bits and performing a read-reclaim operation on the selected memory block according to the comparison result.

Example embodiments of the inventive concept provide an operating method of a nonvolatile memory system including a nonvolatile memory device having a plurality of memory blocks and a memory controller managing an erase leaving time (ELT) of each of the plurality of memory blocks. The operating method comprises reading data from a selected memory block of the plurality of memory blocks; detecting an error bit of read data; comparing a number of the error bit and a reclaim reference value that controlled based on the ELT of the selected memory block; and performing a read-reclaim operation on the memory block according to a result of the comparison.

BRIEF DESCRIPTION OF THE FIGURES

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION OF PREFERRED EMBODIMENTS

Figure 1:
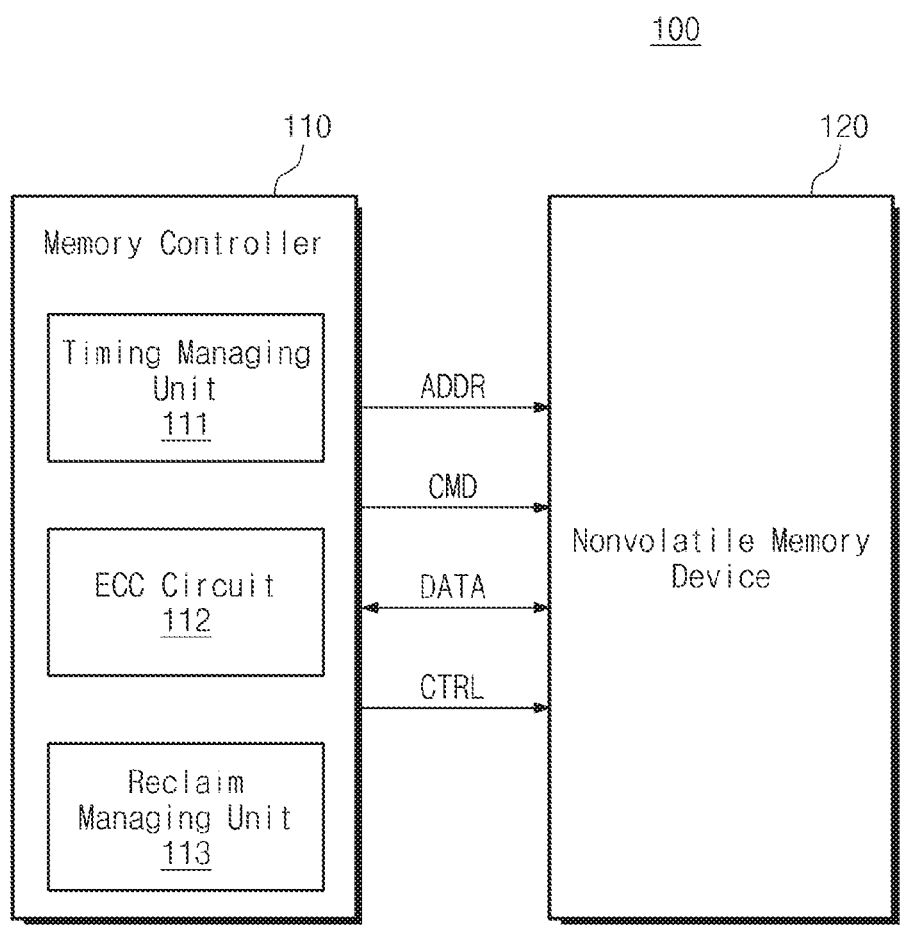
FIG. 1 is a block diagram illustrating a nonvolatile memory system in accordance with some embodiments of the inventive concept.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

A nonvolatile memory system in accordance with the inventive concept manages an erase leaving time of memory cells by a unit of a memory block, a word line, or a page. The nonvolatile memory system may perform a read reclaim operation on the basis of the erase leaving time to guarantee reliability of data stored in memory cells. Thus, a nonvolatile memory system having improved reliability compared as a conventional read reclaim operation is provided.

FIG. 1 is a block diagram illustrating a nonvolatile memory system in accordance with example embodiments of the inventive concept. Referring to FIG. 1, the nonvolatile memory system 100 includes a memory controller 110 and a nonvolatile memory device 120. Each of the memory controller 110 and the nonvolatile memory device 120 may be provided as one chip, one package or one module. Alternatively, the memory controller 110 and the nonvolatile memory device 120 may be formed as one chip, one package or one module to be provided as a storage device such as a memory card, a memory stick, a solid state drive (SSD), etc.

The memory controller 110 may be configured to control the nonvolatile memory device 120. For example, the memory controller 110 may transmit an address ADDR, a command CMD, and a control signal CTRL to the nonvolatile memory device 120 to write data in the nonvolatile memory device 120 or read data stored in the nonvolatile memory device 120 according to an external request.

The nonvolatile memory device 120 may store data received from the memory controller 110 or transmit the stored data to the memory controller 110 under the control of the memory controller 110.

The memory controller 110 includes a timing managing unit 111, an ECC (error correction code) circuit 112 and a reclaim managing unit 113.

The timing managing unit 111 may manage various times in accordance with a physical characteristic of the nonvolatile memory device 120. For example, the timing managing unit 111 may manage program time, elapsed time after an erase, etc. about each of a plurality of memory cells, a plurality of pages, a plurality of word lines, a plurality of memory blocks that are included in the nonvolatile memory device 120. The program time indicates elapsed time from when each of the memory cells, the pages, the word lines and the memory blocks is programmed to the present time. The elapsed time after an erase indicates an elapsed time from when each of the memory cells, the pages, the word lines and the memory blocks is erased to when each of the memory cells, the pages, the word lines and the memory blocks is programmed after it is erased. For brevity of description, the elapsed time after an erase is referred to herein as 'ELT (erase leaving time)'.

The timing managing unit 111 may include a timer (not shown). The timer may generate the present time by counting a clock. The clock may be an external clock received from the outside or an internal clock generated from the inside of the memory controller 110. In exemplary embodiments, the present time may be absolute time. The present time may also be relative time with respect to reference time. The timing managing unit 111 can manage the various times described above using the present time generated by the timer.

The ECC circuit 112 may detect and correct an error of data read from the nonvolatile memory device 120. For example, data stored in the nonvolatile memory device 120 may include errors caused by a variety of factors such as deterioration due to program and read operations, temperature, time, etc. The ECC circuit 112 may detect and correct an error of data including the error.

The reclaim managing unit 113, in the case that an error included in data read from the nonvolatile memory device 120 is greater than a critical value (i.e., the number of error bits is greater than the critical value), may move a part of data of a memory block including memory cells in which the read data is stored to other memory blocks. That is, the reclaim managing unit 113 may move the data described above to other memory blocks to maintain reliability of data including a lot of error bits or reliability of data of which the number of error bits may exceed an error correction ability of the ECC circuit 112. A series of data moving operations is referred to as a 'read reclaim operation'.

In exemplary embodiments, the reclaim managing unit 113 of the memory controller 110 may perform a read reclaim operation or a partial read reclaim operation on the basis of the ELT (erase leaving time) being managed by the timing managing unit 111. The read reclaim operation indicates an operation of moving the whole data (or valid data) in a memory block and the partial read reclaim operation indicates an operation of moving data of a part (i.e., at least one page) in a memory block.

For example, the reclaim managing unit 113 of the memory controller 110 can estimate the number of error cells (or the number of error bits) of each word line on the basis of the ELT being managed by the timing managing unit 111 and the number of error bits of the read data. The reclaim managing unit 113 may perform a partial read reclaim operation on the basis of the estimated number of error cells.

The reclaim managing unit 113 may perform a dummy read operation on the basis of the ELT being managed by the timing managing unit 111 and the number of error bits of the read data.

The reclaim managing unit 113 may control a read reclaim reference value (i.e., the reference number of error bits) on the basis of the ELT being managed by the timing managing unit 111.

Figure 2:
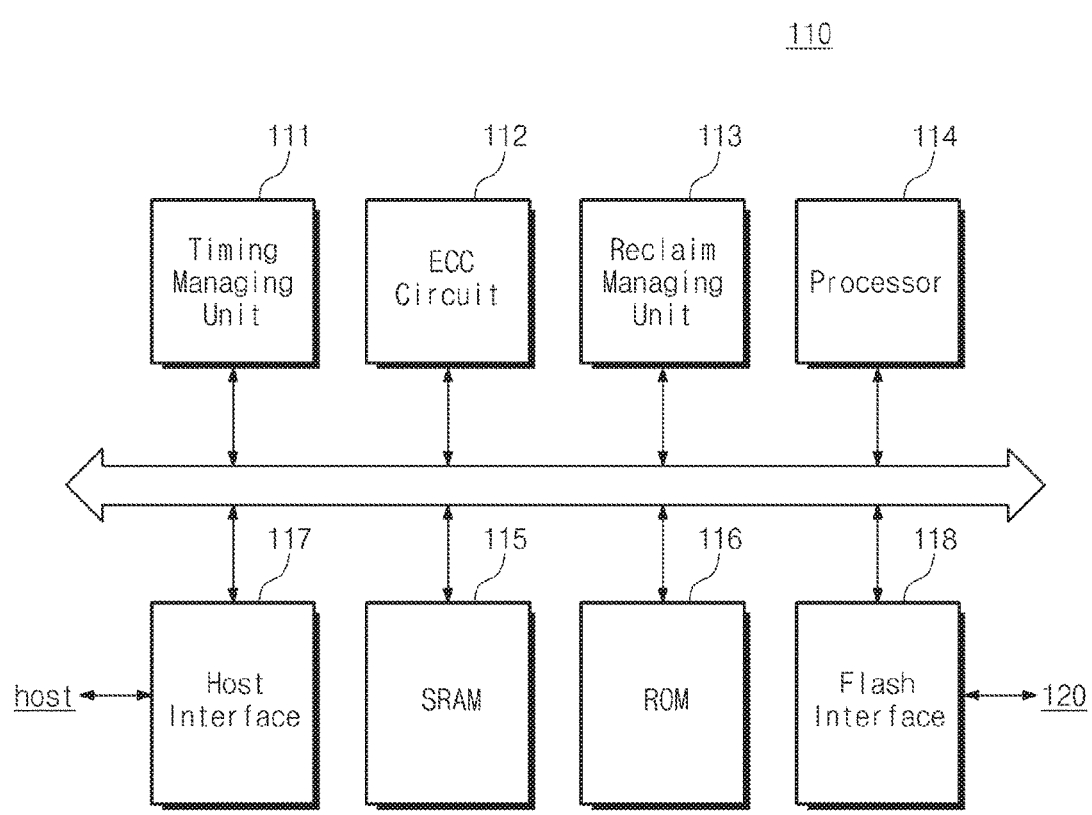
FIG. 2 is a block diagram illustrating a memory controller of FIG. 1 in further detail.

FIG. 2 is a block diagram illustrating an embodiment of a memory controller of FIG. 1 in further detail. Referring to FIGS. 1 and 2, the memory controller 110 includes the timing managing unit 111, the ECC circuit 112, the reclaim managing unit 113, a processor 114, an SRAM 115, a ROM 116, a host interface 117 and a flash interface 118, for example.

Since the timing managing unit 111, the ECC circuit 112 and the reclaim managing unit 113 were described with reference to FIG. 1, a detailed description thereof is omitted.

The processor 114 may control an overall operation of the memory controller 110. The processor 114 may process various arithmetic operations being required for an operation of the memory controller 110.

The SRAM 115 may be used as a buffer memory, a cache memory, an operation memory, etc. of the memory controller 110. The timing managing unit 111 and the reclaim managing unit 113 may be provided in a software form and may be stored in the SRAM 115. The timing managing unit 111 and the reclaim managing unit 113 stored in the SRAM 115 may be driven by the processor 114.

The ROM 116 may store a variety of information being required for an operation of the memory controller 110 in a firmware form. The firmware stored in the ROM 116 may be driven by the processor 114.

The memory controller 110 may communicate with an external device (for example, a host, an application processor, etc.) through the host interface 117. The host interface 117 may include at least one of various interfaces such as a universal serial bus (USB), a multimedia card (MMC), an embedded MMC, a peripheral component interconnection (PCI), a PCI express, an advanced technology attachment (ATA), a serial ATA, a parallel ATA, a small computer small interface (SCSI), an enhanced small disk interface (ESDI), an integrated drive electronics (IDE), a Firewire, a universal flash storage (UFS), etc.

The memory controller 110 may communicate with the nonvolatile memory device 120 through the flash interface 118. The flash interface 118 may include a NAND interface.

Although not illustrated in the drawing, the memory controller 110 may further include a randomizer (not illustrated) for randomizing data to be programmed and derandomizer (not illustrated) for derandomizing data read from the nonvolatile memory device 120.

Figure 3:
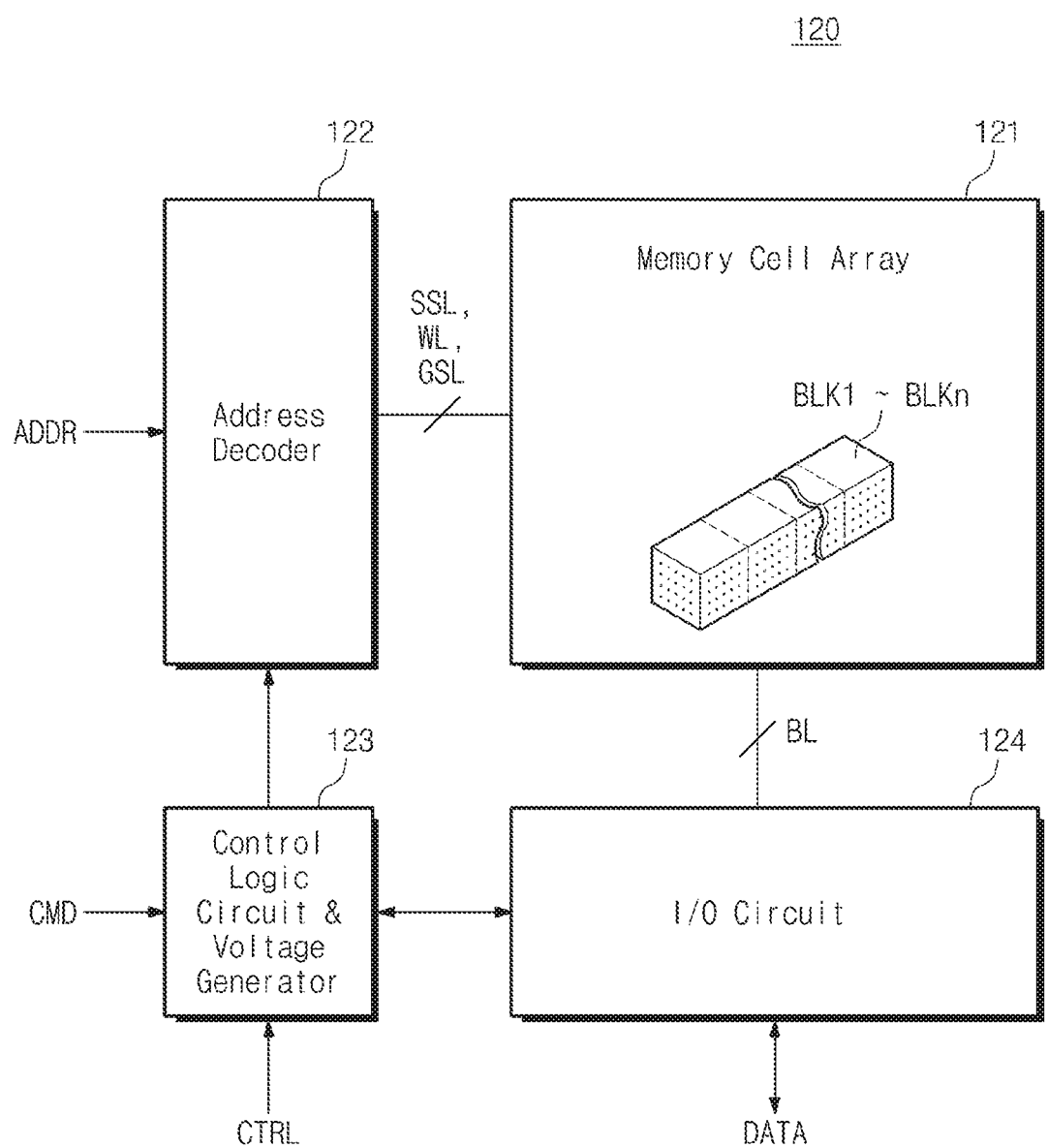
FIG. 3 is a block diagram illustrating a nonvolatile memory device of FIG. 1 in further detail.

FIG. 3 is a block diagram illustrating an embodiment of a nonvolatile memory device of FIG. 1 in further detail. Referring to FIGS. 1 and 3, the nonvolatile memory device 120 includes a memory cell array 121, an address decoder 122, a control logic & voltage generating circuit 123, and an input/output (I/O) circuit 124.

The memory cell array 121 includes a plurality of memory blocks BLK1~BLKn. Each of the memory blocks BLK1~BLKn includes a plurality of cell strings. Each cell string includes a plurality of memory cells. The memory cells are connected to a plurality of word lines respectively. Each memory cell may be an SLC (single level cell) storing 1 bit or a MLC (multi level cell) storing at least 2 bits.

The address decoder 122 is connected to the memory cell array 121 through a plurality of word lines WL, string selection lines SSL and ground selection line GSL. The address decoder 122 receives a physical address ADDR from the memory controller 110 and may decode the received physical address ADDR to select at least one word line among the word lines WL. The address decoder 122 may control a voltage of the selected word line.

The control logic & voltage generating circuit 123 may receive a command CMD and a control signal CTRL. In response to the received signals, the control logic & voltage generating circuit 123 may control the address decoder 122 and the I/O circuit 124 such that data is written in the memory cell array 121 or data written in the memory cell array 121 is read out. The control logic & voltage generating circuit 123 may generate various voltages being required for an operation of the nonvolatile memory device 120. For example, the control logic & voltage generator 123 may generate various voltages such as a plurality of select read voltages, a plurality of unselect read voltages, a plurality of program voltages, a plurality of pass voltages, a plurality of erase voltages, a plurality of sampling voltages, etc.

The I/O circuit 124 is connected to the memory cell array 121 through a plurality of bit lines BL. The I/O circuit 124 may control voltages of the bit lines BL such that data is received from the memory controller 110 and the received data is written in the memory cell array 121. The I/O circuit 124 may control voltages of the bit lines BL to read data stored in the memory cell array 121 under the control of the control logic & voltage generating circuit 123.

In exemplary embodiments, the I/O circuit 124 may include constituent elements such as a page buffer (or page register), a column select circuit, a data buffer, a global buffer, etc. Alternatively, the I/O circuit 124 may include constituent elements such as a sense amplifier, a write driver, a column select circuit, a data buffer, etc.

The memory blocks BLK1~BLKn included in the memory cell array 121 may have a three-dimensional structure stacked in a direction perpendicular to a substrate (not illustrated). For example, each of cell strings included in the memory blocks BLK1~BLKn may include a plurality of memory cells stacked in a direction perpendicular to the substrate. Each memory cell may include a CFT (charge trap flash) memory cell.

In an embodiment of the present inventive concept, the nonvolatile memory device 120 may include a three dimensional (3D) memory array. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The memory cell may include a charge trap layer. Each vertical NAND string may include at least one select transistor located over memory cells, the select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 4:
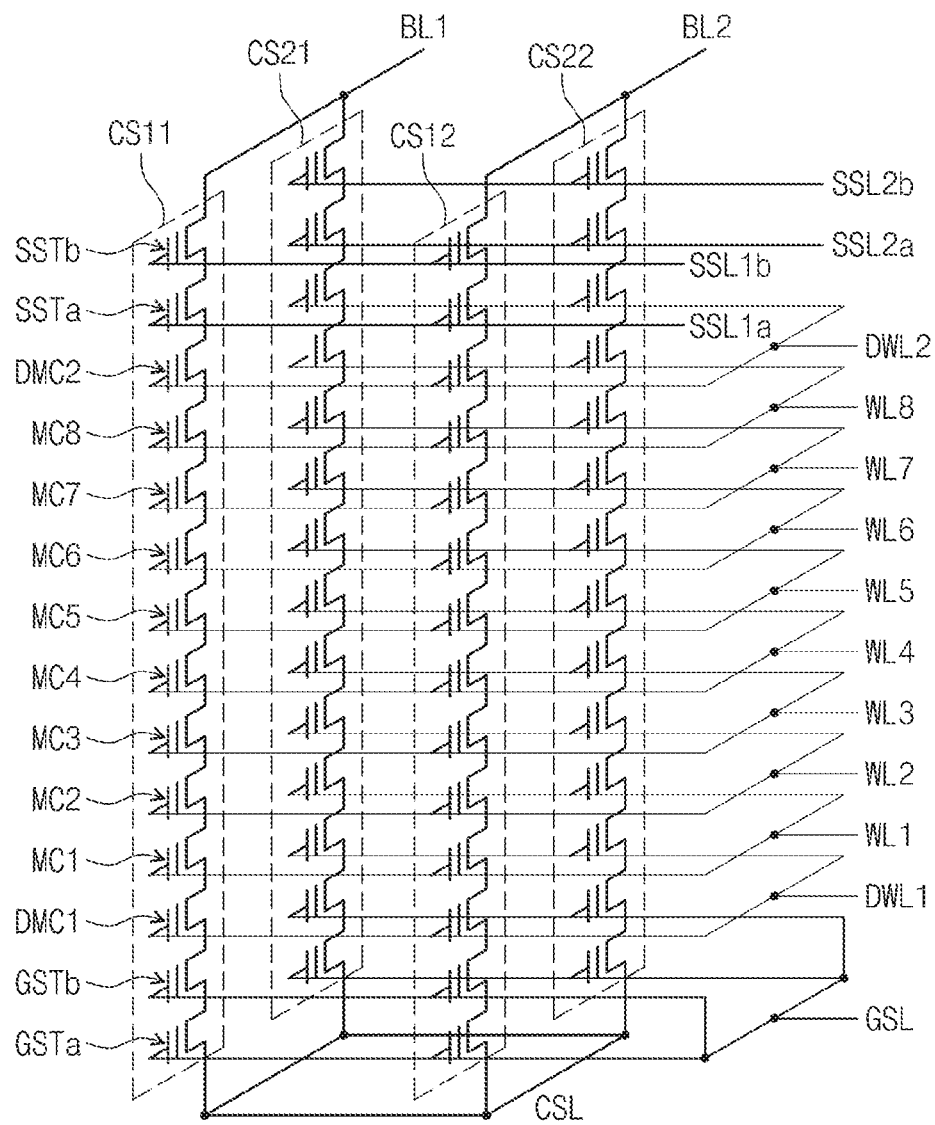
FIG. 4 is a circuit illustrating a first memory block among a plurality of memory blocks illustrated in FIG. 3.

FIG. 4 is a circuit diagram illustrating a first memory block among a plurality of memory blocks illustrated in FIG. 3. The first memory block BLK1 of a three-dimensional structure is described with reference to FIG. 4. The inventive concept is not limited thereto and other memory blocks may also have a similar structure to that of the first memory block BLK1.

The first memory block BLK1 includes a plurality of cell strings CS11, CS12, CS21 and CS22. The cell strings CS11, CS12, CS21 and CS22 may be arranged along a row direction and a column direction to form rows and columns. For example, the cell strings CS11 and CS12 may be connected to string select lines SSL1a and SSL1b to form a first row. The cell strings CS21 and CS22 may be connected to string select lines SSL2a and SSL2b to form a second row.

The cell strings CS11 and CS21 may be connected to a first bit line BLK1 to form a first column. The cell strings CS12 and CS22 may be connected to a second bit line BLK2 to form a second column. Each of the cell strings CS11, CS12, CS21 and CS22 includes a plurality of cell transistors. For example, each of the cell strings CS11, CS12, CS21 and CS22 may include string select transistors SSTa and SSTb, a plurality of memory cells MC1~MC8, ground select transistors GSTa and GSTb and dummy memory cells DMC1 and DMC2.

Each cell transistor included in the cell strings CS11, CS12, CS21 and CS22 may be a CTF (charge trap flash) memory cell.

The memory cells MC1~MC8 are serially connected to another and are stacked in a height direction perpendicular to a plane or substrate (not shown) formed by row direction and a column direction. The string select transistors SSTa and SSTb are serially connected to each other and are provided between the bit line BL and the memory cells MC1~MC8. The ground select transistors GSTa and GSTb are serially connected to each other and are provided between a common source line CSL and the memory cells MC1~MC8.

The first dummy cell DMC1 may be provided between the ground select transistors GSTa and GSTb and the memory cells MC1~MC8. The second dummy cell DMC2 may be provided between the string select transistors SSTa and SSTb and the memory cells MC1~MC8.

The ground select transistors GSTa and GSTb of the cell strings CS11, CS12, CS21 and CS22 may be connected to a ground select line GSL in common.

Ground select transistors of the same row may be connected to the same ground select line and ground select transistors of different rows may be connected to different ground select lines. For example, the first ground select transistor GSTa of the cell strings CS11 and CS12 of the first row may be connected to a first ground select line and the first ground select transistor GSTa of the cell strings CS21 and CS22 of the second row may be connected to a second ground select line.

Although not illustrated in the drawing, ground select transistors provided at the same height from a substrate (not shown) may be connected to the same ground select line and ground select transistors provided at different heights may be connected to different ground select lines. For example, the first ground select transistors GSTa of the cell strings CS11, CS12, CS21 and CS22 may be connected to the first ground select line and the second ground select transistors GSTb of the cell strings CS11, CS12, CS21 and CS22 may be connected to the second ground select line.

Memory cells located at the same height from the substrate (or the ground select transistors GSTa and GSTb) are connected to the same word line in common and memory cells located at different heights are connected to different word lines. For example, the first through eighth memory cells MC1~MC8 of the cell strings CS11, CS12, CS21 and CS22 are connected to first through eighth word lines WL1~WL8 in common.

Among the first string transistors SSTa of the same height, string select transistors of the same row are connected to the same string select line and string select transistors of different rows are connected to different string select lines. For example, the first string select transistors SSTa of the cell strings CS11 and CS12 of the first row are connected to the string select line SSL1a in common and the first string select transistors SSTa of the cell strings CS21 and CS22 of the second row are connected to the string select line SSL2a in common.

Similarly, among the second string transistors SSTb of the same height, string select transistors of the same row are connected to the same string select line and string select transistors of different rows are connected to different string select lines. For example, the second string select transistors SSTb of the cell strings CS11 and CS12 of the first row are connected to the string select line SSL1b in common and the second string select transistors SSTa of the cell strings CS21 and CS22 of the second row are connected to the string select line SSL2b in common.

Although not illustrated in the drawing, string select transistors of cell strings of the same row may be connected to the same string select line in common. For example, the first and second string select transistors SSTa and SSTb of the cell strings CS11 and CS12 of the first row may be connected to the same string select line in common. The first and second string select transistors SSTa and SSTb of the cell strings CS21 and CS22 of the second row may be connected to the same string select line in common.

Dummy memory cells of the same height are connected to the same dummy word line and dummy memory cells of different heights are connected to different word lines. For example, the first dummy memory cells DMC1 are connected to a first dummy word line DWL1 and the second dummy memory cells DMC2 are connected to a second dummy word line DW2.

In the first memory block BLK1, read and write operations may be performed by a row unit. For example, one row of the first memory block BLK1 may be selected by the string select lines SSL1a, SSL1b, SSL2a and SSL2b.

For example, when a turn-on voltage is supplied to the string select lines SSL1a and SSL1b and a turn-off voltage is supplied to the string select lines SSL2a and SSL2b, the cell strings CS11 and CS12 of the first row are connected to the bit lines BL1 and BL2. When a turn-on voltage is supplied to the string select lines SSL2a and SSL2b and a turn-off voltage is supplied to the string select lines SSL1a and SSL1b, the cell strings CS21 and CS22 of the second row are connected to the bit lines BL1 and BL2.

Among memory cells of a cell string of a row being driven by driving a word line, memory cells of the same height are selected. Read and write operations may be performed in the selected memory cells. The selected memory cells may form a physical page unit.

In the first memory block BLK1, an erase operation may be performed by a memory block unit or a sub block unit. When an erase operation is performed by a block unit, all the memory cells MC of the first memory block BLK1 may be erased at the same time according to one erase request. When an erase operation is performed by a sub block unit, some of the memory cells MC of the first memory block BLK1 may be erased at the same time according to one erase request and some remaining memory cells MC may be erase-prohibited. A low voltage (for example, a ground voltage) may be supplied to a word line connected to memory cells being erased and a word line connected to erase-prohibited memory cells may be floated.

The first memory block BLK1 illustrated in FIG. 4 is illustrative and the number of cell strings may increase or decrease. The number of rows and columns formed by cell strings may increase or decrease depending on the number of the cell strings. The number of cell transistors GST, MC, DMC, SST, etc. of the first memory block BLK1 may increase or decrease and a height of the first memory block BLK1 may increase or decrease depending on the number of the cell transistors. The number of lines GSL, WL, SSL, etc. connected to the cell transistors may increase or decrease depending on the number of the cell transistors.

Figure 5:
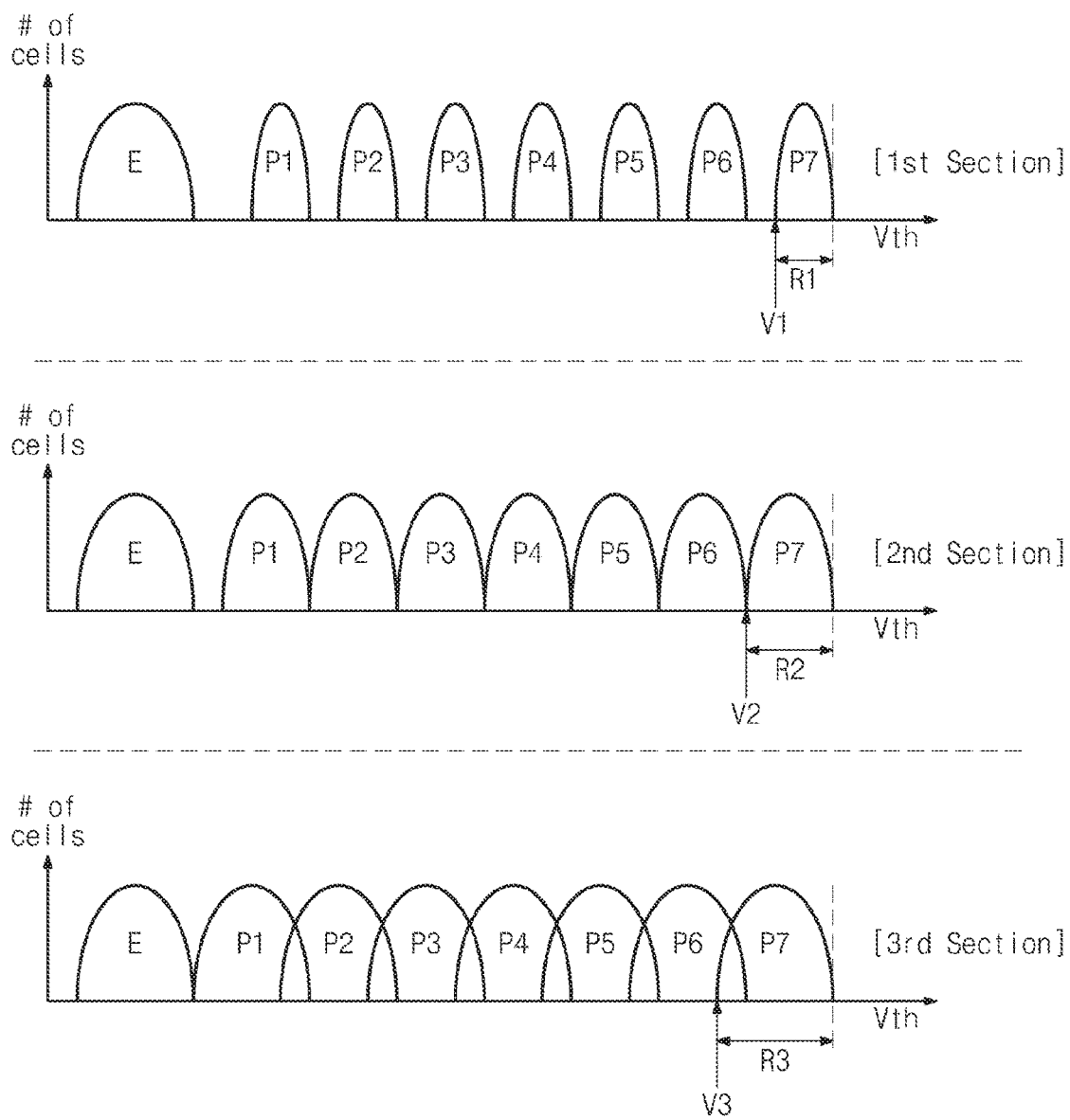
FIG. 5 is a scatter diagram illustrating a change of threshold voltages of memory cells.

FIG. 5 is a distribution diagram for illustrating a change of threshold voltages of memory cells.

In FIG. 5, X axes indicate a threshold voltage of memory cells and Y axes indicate the number of memory cells. For brevity of description, a threshold voltage distribution diagram of memory cells connected to a first word line WL1 is illustrated in FIG. 5. It is assumed that each memory cell is a TLC (triple level cell) storing 3 bits. However, the inventive concept is not limited thereto.

Referring to a first section of FIGS. 4 and 5, in the case that the first memory block BLK1 is erased, the memory cells MC included in the first memory block BLK1 may have an erase state E. At a time when a predetermined time elapsed after the first memory block BLK1 is erased, memory cells connected to the first word line WL1 may be programmed to have an erase state E and first through seventh program states P1~P7. The predetermined time may be an ELT (erase leaving time).

Figure 15:
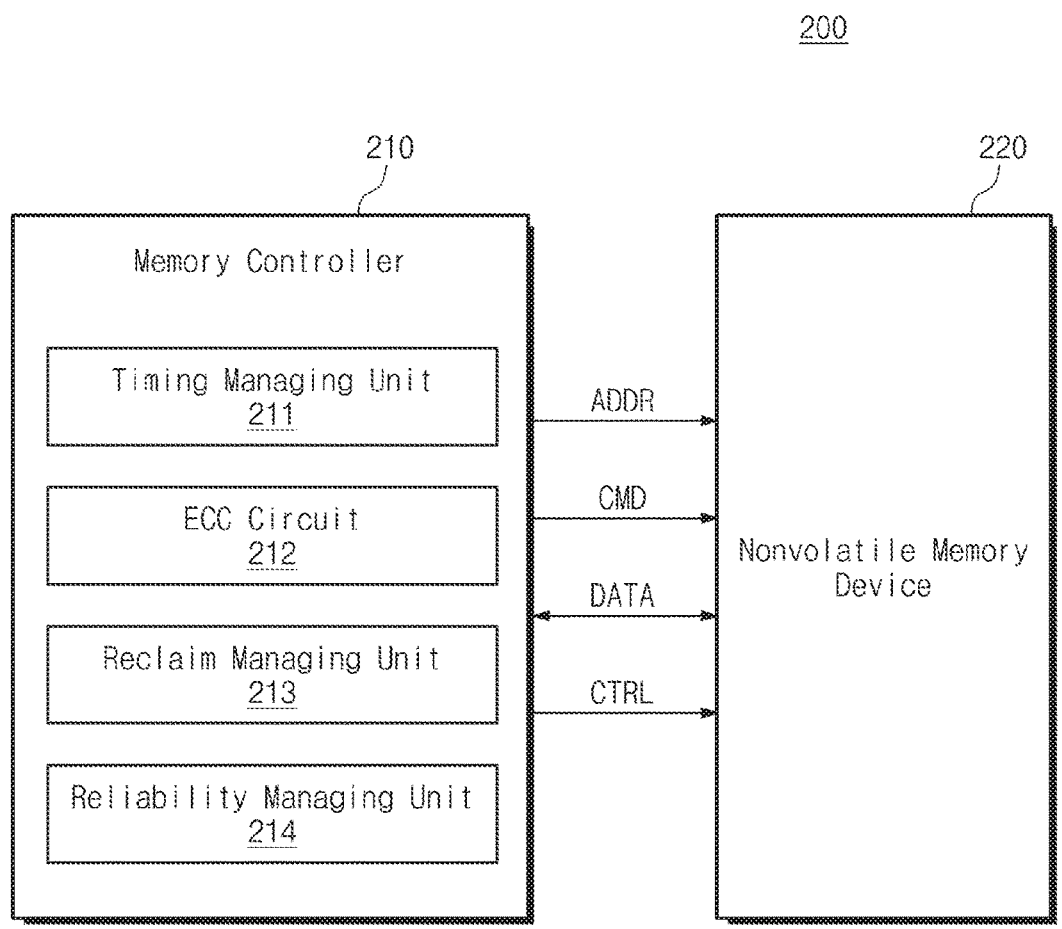
FIG. 15 is a block diagram illustrating a nonvolatile memory system in accordance with some other embodiments of the inventive concept.

Threshold voltage distribution diagrams of second and third sections of FIG. 5 illustrate a change of a threshold voltage distribution of memory cells of the first word line WL1 according to the same program elapsed time. The second section of FIG. 15 is a threshold voltage distribution diagram of when an ELT of the first word line WL1 is a first time and the third section of FIG. 15 is a threshold voltage distribution diagram of when an ELT of the first word line WL1 is a second time. The second time is longer than the first time.

As time elapses after memory cells are programmed, a threshold voltage (or threshold voltage distribution) of programmed memory cells may be changed. For example, as illustrated in the second section of FIG. 5, in the case that the ELT is the first time, a lower bound value of a threshold voltage distribution of memory cells having the seventh program state P7 may be lowered from a first voltage V1 to a second voltage V2 depending on a program elapsed time. A width of a threshold voltage distribution of the memory cells having the seventh program state P7 may be widened from a first width R1 to a second width R2. That is, as time elapses after the memory cells MC are programmed, a lower bound value of a threshold voltage distribution of the memory cells MC may be lower and a width of a threshold voltage distribution of the memory cells MC may be wide. If a lower bound value of a threshold voltage distribution of the memory cells MC is lowered and a width of a threshold voltage distribution of the memory cells MC is wide, in a read operation of the memory cells MC, a probability that an error may occur increases. That is, reliability of the memory cells MC may be reduced.

As illustrated in the third section of FIG. 5, in the case that the ELT is the second time longer than the first time, a lower bound value of a threshold voltage distribution of memory cells MC having the seventh program state P7 may be lowered from a first voltage V1 to a second voltage V3 depending on a program elapsed time. A width of a threshold voltage distribution of the memory cells MC having the seventh program state P7 may be widened from a first width R1 to a third width R3.

As illustrated in FIG. 5, the third voltage V3 is lower than the second voltage V2 and the third width R3 is wider than the second width R2. As the ELT increases, the amount of change in threshold voltages of the memory cells MC increases, a lower bound value of a threshold voltage distribution of the memory cells MC is lower and a width of a threshold voltage distribution of the memory cells is wide. That is, as the ELT increases, reliability of the memory cells is reduced.

Figure 6:
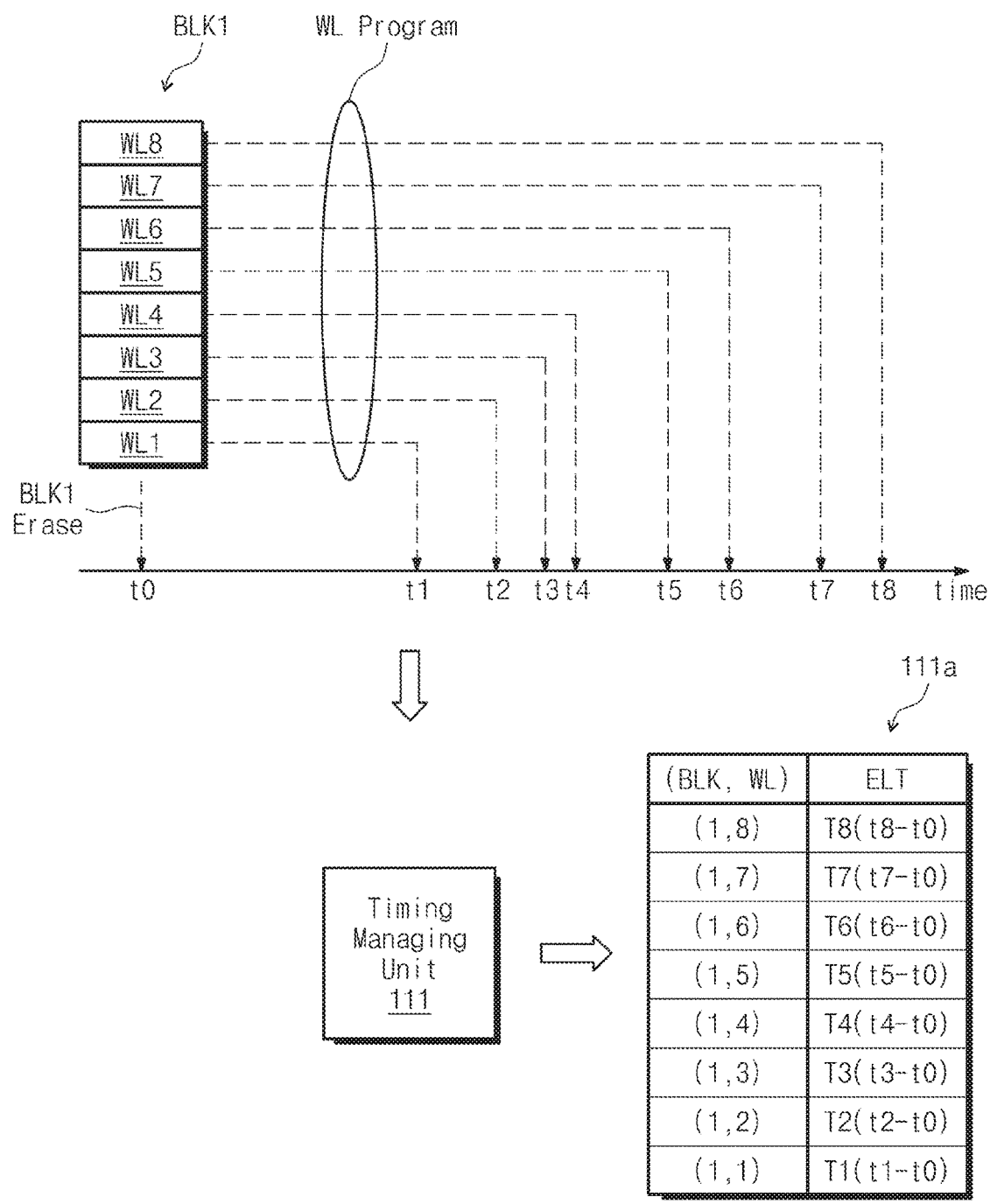
FIG. 6 is a drawing for explaining an erase leaving time being managed by a memory controller.

FIG. 6 is a drawing for explaining an erase leaving time being managed by a memory controller. For brevity of description, an operating method is described based on the first memory block BLK1. That is, it is assumed that the first memory block BLK1 is a memory block selected by a read request of a host and a word line selected by the read request of the host is included in the first memory block BLK1. It is assumed that the remaining word lines are unselected word lines. However, the inventive concept is not limited thereto. The ELT may be managed by a word line unit.

For brevity of description, it is assumed that a program order of a word line is sequentially programmed from a low-order word line to a high-order word line. Thus, after a first word line WL1 of the first memory block BLK1 is programmed, a second word line WL2 is programmed and after the second word line WL2 is programmed, a third word line WL3 is programmed. However, the inventive concept is not limited thereto and a program order of the word line may be variously changed.

Referring to FIGS. 1 and 6, the first memory block BLK1 may be erased at a zero-th time point t0. After that, the first through eighth word lines WL1~WL8 of the first memory block BLK1 may be sequentially programmed. For example, memory cells connected to the first through eighth word lines WL1~WL8 respectively may be programmed at first through eighth time points t1~t8 respectively. The programmed memory cells may have the erase state E and the first through seventh program states P1~P7 described with reference to FIG. 5.

An ELT (erase leaving time) of the first word line WL1 may be a first time T1. The first time T1 indicates a time elapsed from the zero-th time point t0 to the first time point t1. Similarly, second through eighth times T2~T8 may be ELTs of the second through eighth word lines WL2~WL8 respectively. The second through eighth times T2~T8 indicate times elapsed from the zero-th time point t0 to the second through eighth time points t2~t8, respectively.

The timing managing unit 111 of the memory controller 110 may manage the ELTs of the first through eighth word lines WL1~WL8 by an erase time table 111*a*.

The management method of the ELT described with reference to FIG. 6 is illustrative and the inventive concept is not limited thereto. For example, the timing managing unit 111 may manage the ELT based on a page unit, a word line unit, a sub block unit, a memory block unit, a plane unit, and a chip unit.

According to a program order, an ELT of a high-order word line may be shorter than an ELT of a low-order word line. The high-order word line indicates a word line on a bit line's side and the low-order word line indicates a word line on a common source line's side. For example, as illustrated in FIG. 6, the erase leaving time (T8) of the eighth word line WL8 is longer than the erase leaving time (T7) of the seventh word line WL7. However, in the case that the eighth word line WL8 (i.e., high-order word line) is programmed before the seventh word line WL7 (i.e., low-order word line) according to a program order, the erase leaving time (T8) of the eighth word line WL8 may be shorter than the erase leaving time (T7) of the seventh word line WL7.

Figure 7:
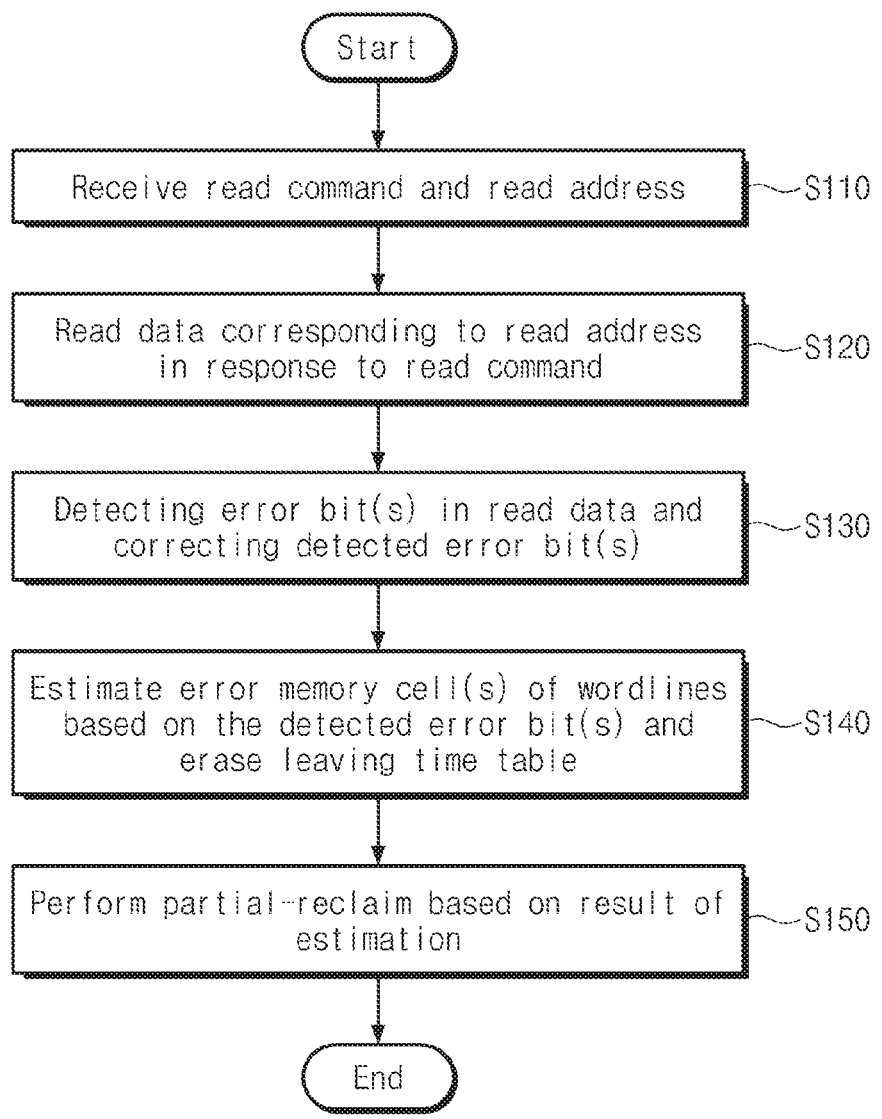
FIG. 7 is a flowchart illustrating an operating method of a memory controller in accordance with some embodiments of the inventive concept.

FIG. 7 is a flowchart illustrating an operating method of a memory controller in accordance with some embodiments of the inventive concept. Referring to FIG. 7, a partial read reclaim operation of the memory controller 110 is described.

Referring to FIGS. 1 and 7, in a step S110, the memory controller 110 receives a read command and a read address from a host.

In a step S120, the memory controller 110 reads data corresponding to a read address in response to the received read command. For example, the read address received from the host may be a logical address. The memory controller 110 may perform an address translation operation to select a physical address of the nonvolatile memory device 120 corresponding to the received read address (i.e., logical address). The memory controller 110 may read data stored in an area corresponding to the selected physical address. The address translation operation may be performed by a FTL (flash translation layer). The FTL may perform the address translation operation using a mapping table.

In a step S130, the memory controller 110 may detect an error bit of read data and correct the detected error bit. Error bit detection and correction operations of data may be performed by the ECC circuit 112 of the memory controller 110.

In a step S140, the memory controller 110 may estimate error memory cells (or the number of error memory cells or the number of error bits) of a plurality of word lines based on the detected error bit and the erase time table. The memory controller 110 may estimate error memory cells (or the number of error memory cells or the number of error bits) of unselected word lines.

In exemplary embodiments, as described with reference to FIG. 6, the memory controller 110 may manage an ELT of each of the word lines. As described with reference to FIG. 5, as an ELT becomes long, reliability of the memory cells may be lowered.

The memory controller 110 may estimate error memory cells (or the number of error memory cells or the number of error bits) of each of the word lines based on the number of detected error bits and the ELT of the word lines. For brevity of description, the number of error bits included in data stored in memory cells connected to one word line is referred to as 'the number of error bits of word line'.

The number of detected error bits of the third word line WL3 may be 'a' ('a' is a natural number). As illustrated in FIG. 6, an ELT of the third word line WL3 may be the third time T3 and ELTs of the first, second, and fourth through eighth word lines WL1, WL2 and WL4~WL8 may be first, second, and fourth through eighth times T1, T2 and T4~T8 respectively. The first and second times T1 and T2 are shorter than the third time T3 and the fourth through eighth times T4~T8 are longer than the third time T3.

The memory controller 110 may estimate that the number of error bits of the first and second word lines WL1 and WL2 are 'b' and 'c', respectively (a>c>b). As described with reference to FIG. 5, since the ELT of the first word line WL1 is shorter than an ELT of the second word line WL2 and the ELT of the second word line WL2 is shorter than an ELT of the third word line WL3, the estimated number of error bits of the first word line WL1 is smaller than the estimated number of error bits of the second word line WL2 and the estimated number of error bits of the second word line WL is smaller than the detected number of error bits of the third word line WL3.

The memory controller 110 can estimate that the number of error bits of the fourth through eighth word lines WL4~WL8 are 'd', 'e', 'f', 'g', and 'h' respectively (h>g>f>e>d>a and d, e, f, g and h are natural numbers) on the basis of the ELT. Since the erase leaving times T4~T8 of the fourth through eighth word lines WL4~WL8 are longer than the erase leaving time T3 of the third word line WL3, the estimated number of error bits of the fourth through eighth word lines WL4~WL8 may be greater than the detected error bits of the third word line WL3.

In other words, as the ELT increases, the number of error bits estimated by the memory controller 110 may increase.

The estimated number of error bits may linearly increase according to the ELT. The estimated number of error bits may also increase on a logarithmic scale according to the ELT. The estimated number of error bits may also increase according to a predetermined increment or a predetermined mathematical formula according to the ELT.

In a step S150, the memory controller 110 may perform a partial read reclaim operation on the basis of the estimated number of error bits. For example, the memory controller 110 may select a word line having the estimated number of error bits exceeding a read reclaim reference value RC_ref. The read reclaim reference value RC_ref may be a value for selecting a memory block or word line in which a read reclaim operation is to be performed. The read reclaim reference value RC_ref may be a value previously determined considering a characteristic of the nonvolatile memory device 120.

That the estimated number of error bits of a specific word line exceeds the read reclaim reference value RC_ref means that reliability of data stored in the specific word line is not guaranteed. Accordingly, the memory controller 110 may perform a partial read reclaim operation on selected word lines. That is, the memory controller 110 may read data stored in selected word lines and move the read data to a free block or an open block. The free block indicates a memory block of an erase state and the open block indicates a memory block a part of which is in an erase state.

The memory controller 110, in a read operation, may estimate the number of error bits of each of word lines on the basis of the number of error bits of read data and an ELT of each of the word lines. The memory controller 110 performs a partial read reclaim operation on the basis of the result of estimation. Thus, a nonvolatile memory device having improved reliability is provided.

Figure 8:
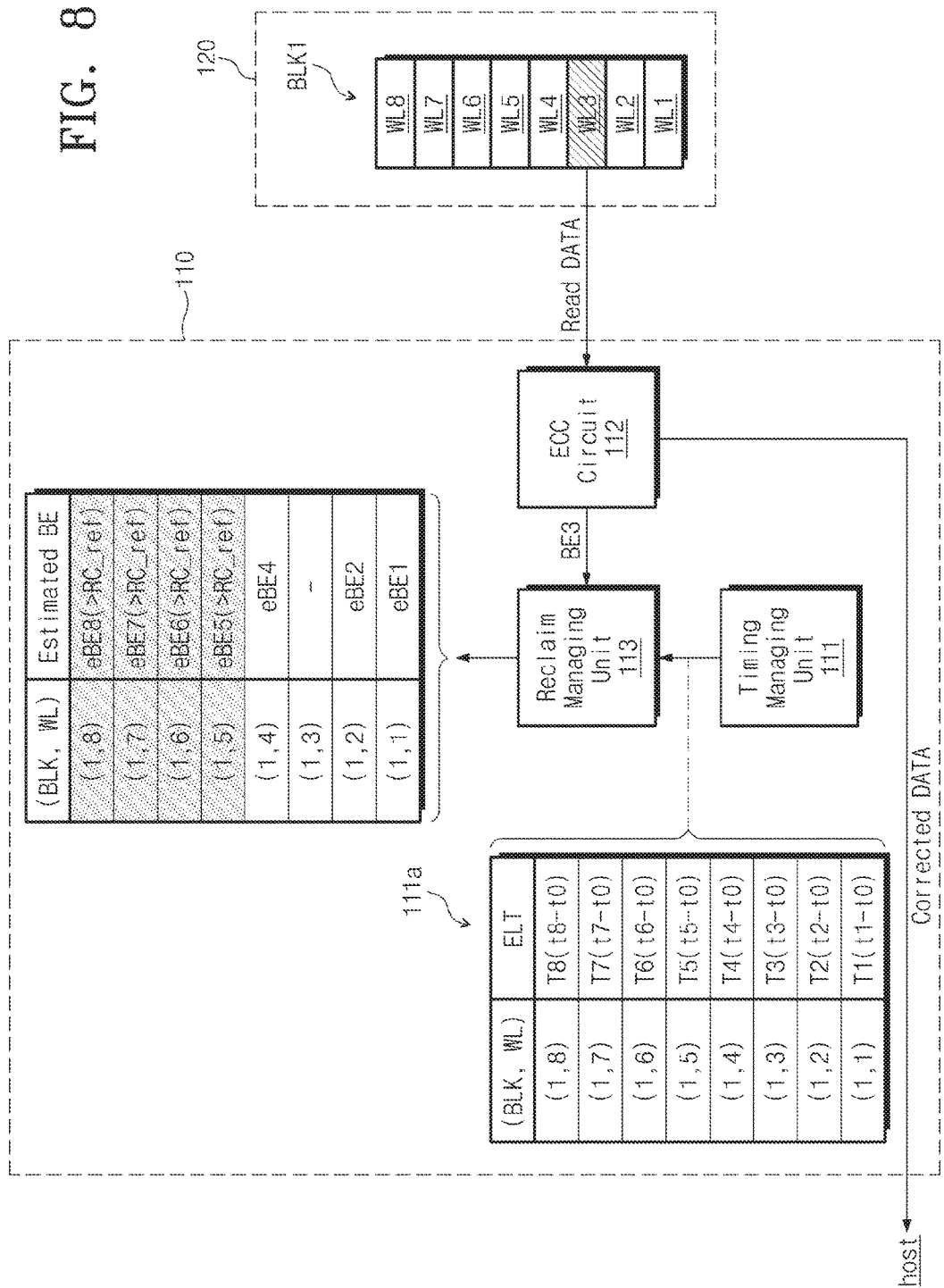
FIGS. 8 and 9 are drawings for explaining the operating method of FIG. 7.
Figure 9:
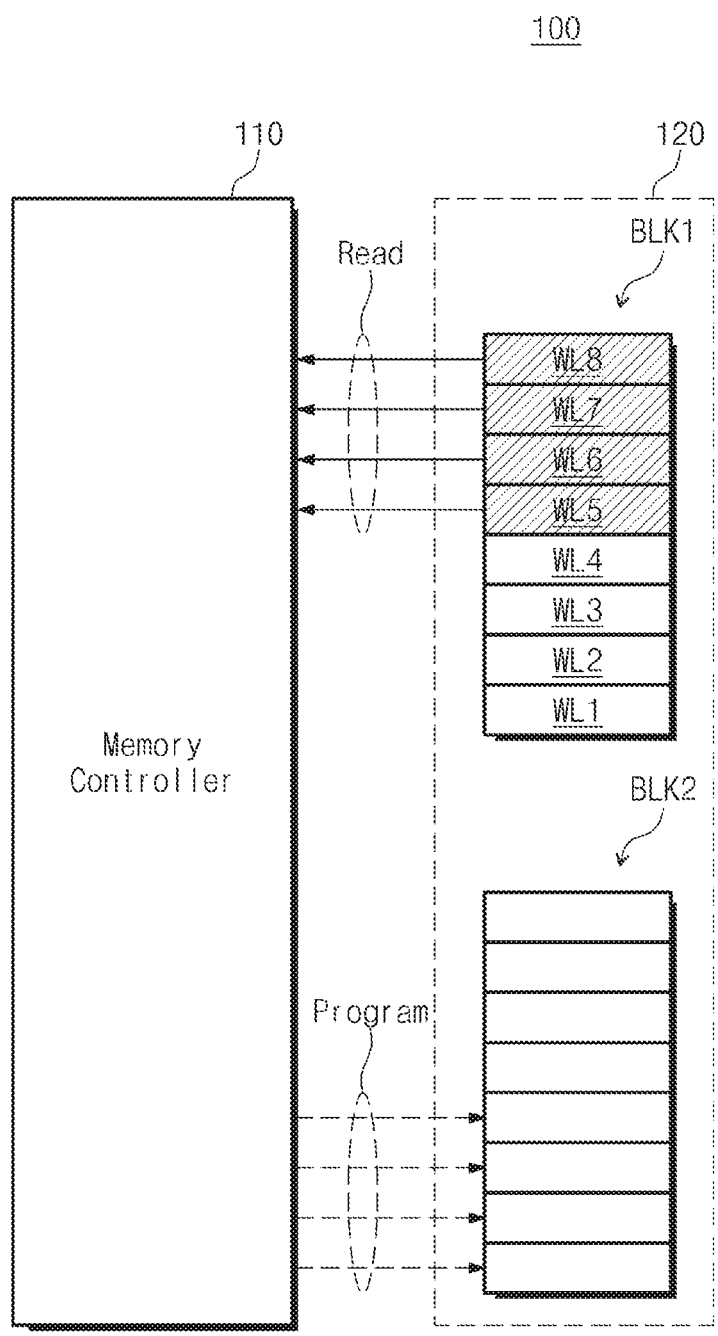

FIGS. 8 and 9 are drawings for explaining the operating method of FIG. 7. For brevity of description, various elements unnecessary for describing an operating method of the inventive concept are omitted.

Referring to FIGS. 7 and 8, the memory controller 110 may read data from a third word line WL3 of the first memory block BLK1. The data read from the nonvolatile memory device 120 may include error bits. The ECC circuit 112 can detect and correct the error bits of the read data. The corrected data DATA may be transmitted to a host. The ECC circuit 112 may transmit information on the detected error bits to the reclaim managing unit 113. The information on the detected error bits may indicate the number of the detected error bits.

As described with reference to FIG. 6, the timing managing unit 111 may manage an ELT of each of first through eighth word lines WL1~WL8 of the first memory block BLK1 by an erase time table 111a.

The reclaim managing unit 113 may estimate the number of error bits of the first, second, and the fourth through eighth word lines WL1, WL2, and WL4~WL8. In other words, the reclaim managing unit 113 may estimate the number of error bits of unselected word lines.

As described above, as an ELT of each word line increases, the estimated number (eBE1, eBE2, eBE4~eBE8) of error bits of the first, second, and the fourth through eighth word lines WL1, WL2, and WL4~WL8 may also increase. For example, as described with reference to FIG. 6, according to a program order, ELTs of the first through eighth word lines WL1~WL8 may sequentially increase. Accordingly, the number of error bits of the first through eighth word lines WL1~WL8 may also increase. The estimated number of error bits of the word lines WL1, WL2 and WL4~WL8 may be first, second and fourth through eighth estimation values (eBE1, eBE2, eBE4~eBE8).

The memory controller 110 may compare each of the estimation values (eBE1, eBE2, eBE4~eBE8) with the reclaim reference value RC_ref to select word lines to be partially read-reclaimed. For example, as illustrated in FIG. 8, each of the fifth through eighth estimation values eBE5~eBE8 may be greater than the reclaim reference value RC_ref. In this case, the reclaim managing unit 113 can select the fifth through eighth word lines WL5~WL8 as targets of a partial read reclaim operation.

Referring to FIG. 9, the memory controller 110 may perform a partial read reclaim operation on selected word lines (that is, word lines to be partially read-reclaimed). The memory controller 110 can sequentially read data stored in the fifth through eighth word lines WL5~WL8 and program the read data in a second memory block BLK2. The second memory block BLK2 may be a free block or an open memory block. The open memory block indicates a memory block having a part of which is in a program state and the remaining part of which is in an erase state.

In exemplary embodiments, the memory controller 110 may read all the data stored in the fifth through eighth word lines WL5~WL8 and then may program the read data in the second memory block BLK2. Alternatively, the memory controller 110 may repeatedly perform read and program operations of data by a word line unit. For example, the memory controller 110 may read data of the fifth word line WL5 and program the read data in the second memory block BLK2. After that, the memory controller 110 may read data of the sixth word line WL6 and program the read data in the second memory block BLK2.

The memory controller 110 may read data stored in the fifth through eighth word lines WL5~WL8 and correct an error of the read data. The memory controller 110 may program error-corrected data in the second memory block BLK2.

After data stored in each of the fifth through eighth word lines WL5~WL8 is moved to the second memory block BLK2, the memory controller 110 may invalidate data stored in each of the fifth through eighth word lines WL5~WL8.

The embodiment of the inventive concept described above is illustrative and the inventive concept is not limited thereto. For example, an erase leaving time (ELT) may not sequentially increase according to a program order of word line. In this case, low-order word lines (for example, first or second word line WL1 or WL2) may be selected as a word line to be partially read-reclaimed.

In exemplary embodiments, the memory controller 110 may store information on a word line to be partially read-reclaimed in the SRAM 115. The memory controller 110 may perform a partial read reclaim operation on the basis of information stored in the SRAM 115 during idle time (or a background operation).

According to a conventional read reclaim operation method, a read reclaim operation is performed by comparing an error bit of the read data with the reclaim reference value. However, since the nonvolatile memory system 100, even though an error bit of the read data is smaller than the reclaim reference value, estimates the deterioration degree of the remaining word line (that is, estimates the number of error bits on the basis of ELT (erase leaving time)) to perform a partial read reclaim operation, data reliability is improved.

According to the embodiment of the inventive concept described above, the nonvolatile memory system 100 may manage ELT (that is, time elapsed between the time the memory cells are erased and the time the memory cells are programmed) of memory cells. In a read operation, the nonvolatile memory system 100 may estimate the number of error bits of the word lines on the basis of the number of error bits of the read data and the ELT. The nonvolatile memory system 100 may perform a partial read reclaim operation on the basis of the estimated number of error bits. Thus, a nonvolatile memory system having improved reliability and an operating method thereof are provided.

Figure 10:
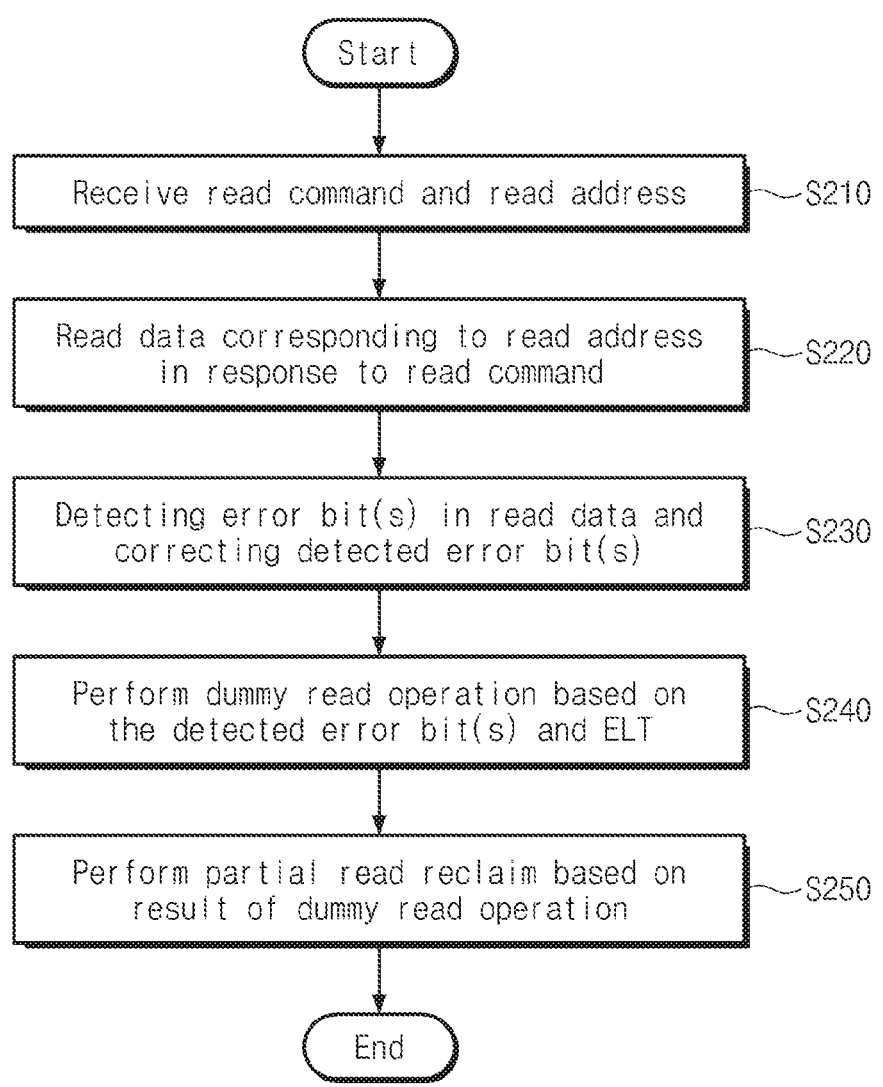
FIG. 10 is a flowchart illustrating an operating method of a memory controller in accordance with some other embodiments of the inventive concept.

FIG. 10 is a flowchart illustrating an operating method of a memory controller in accordance with some other embodiments of the inventive concept. Referring to FIGS. 1 and 10, steps S210, S220 and S230 are the same as the steps S110, S120 and S130 of FIG. 7. Thus, a detailed description thereof is omitted.

In a step S240, the memory controller 110 may perform a dummy read operation on the basis of information BT about detected error bit and ELT. The dummy read operation indicates a read operation for detecting the number of error bits of a specific word line. Data read by the dummy read operation is not transmitted to a host.

For example, the memory controller 110 may select a word line on the basis of information (BE) on detected error bits and ELT (erase leaving time). The memory controller 110 may perform a dummy read operation on a selected word line to detect the number of error bits of data stored in the selected word line.

The memory controller 110 may compare the number of error bits detected through a dummy read operation with the reclaim reference value to further perform a dummy read operation. In the case that the number of error bits detected through the dummy read operation is greater than the reclaim reference value, the memory controller 110 may further perform a dummy read operation on a low order word line. For example, in the case that the reclaim reference value is 100 bit and the number of error bits of the fifth word line WL5 through the dummy read operation is 150 bit, the memory controller 110 may further perform a dummy read operation on the fourth word line WL4 having ELT shorter than that of the fifth word line WL5.

In the case that the number of error bits detected through the dummy read operation is smaller than the reclaim reference value, the memory controller 110 may further perform a dummy read operation on a high order word line. For example, in the case that the reclaim reference value is 100 bit and the number of error bits of the fifth word line WL5 through the dummy read operation is 80 bit, the memory controller 110 may further perform a dummy read operation on the sixth word line WL6 having ELT longer than that of the fifth word line WL5.

In exemplary embodiments, the dummy read operation may be performed under a specific condition. For example, in the case that a word line exists which is estimated to have the number of error bits greater than the reclaim reference value among the first through eighth word lines WL1~WL8 included in the first memory block BLK1, the dummy read operation may be performed.

In a step S250, the memory controller performs a partial read reclaim operation according to a result of the dummy read operation. For example, the memory controller 110 may detect the number of error bits of a part of the word lines through the dummy read operation. The memory controller 110 may determine word lines to be partially read-reclaimed on the basis of the detected number of error bits.

Figure 11:
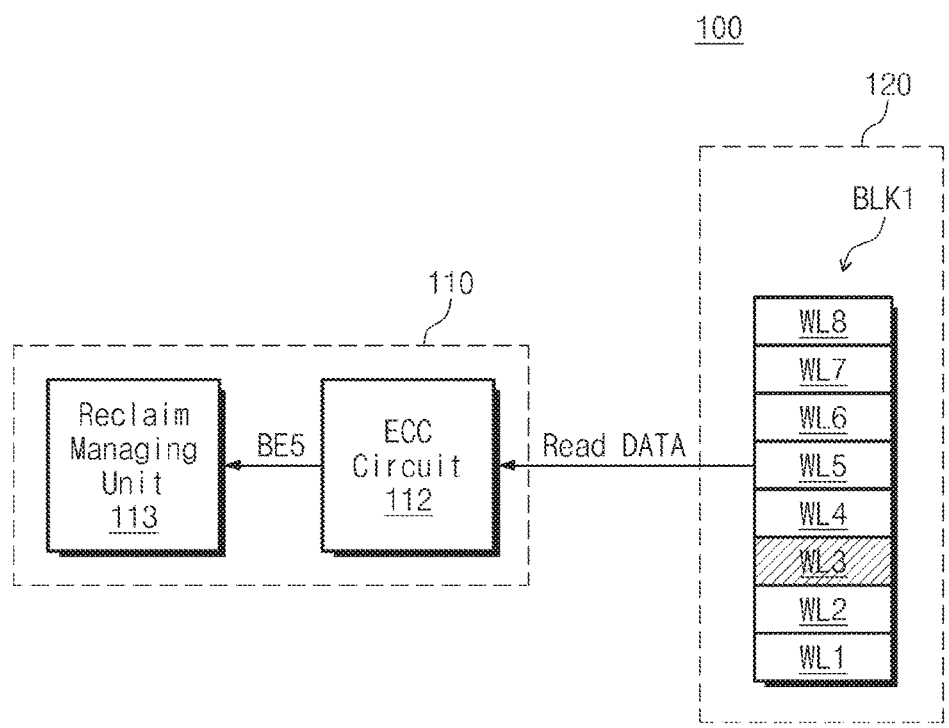
FIGS. 11 through 13 are drawings for explaining the operating method of FIG. 10.
Figure 12:
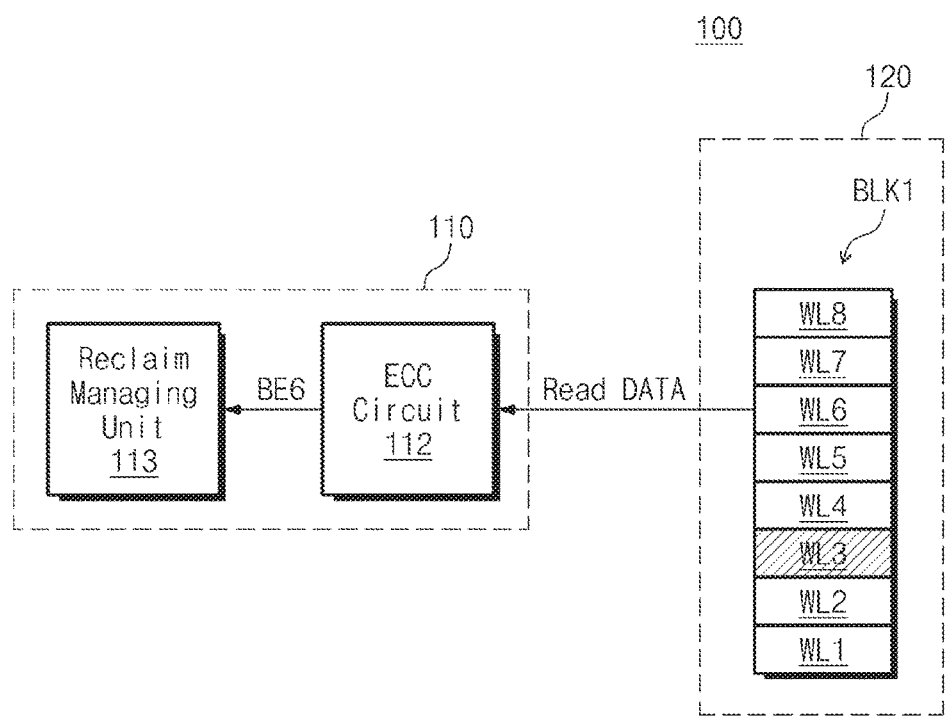
Figures 13, 14:
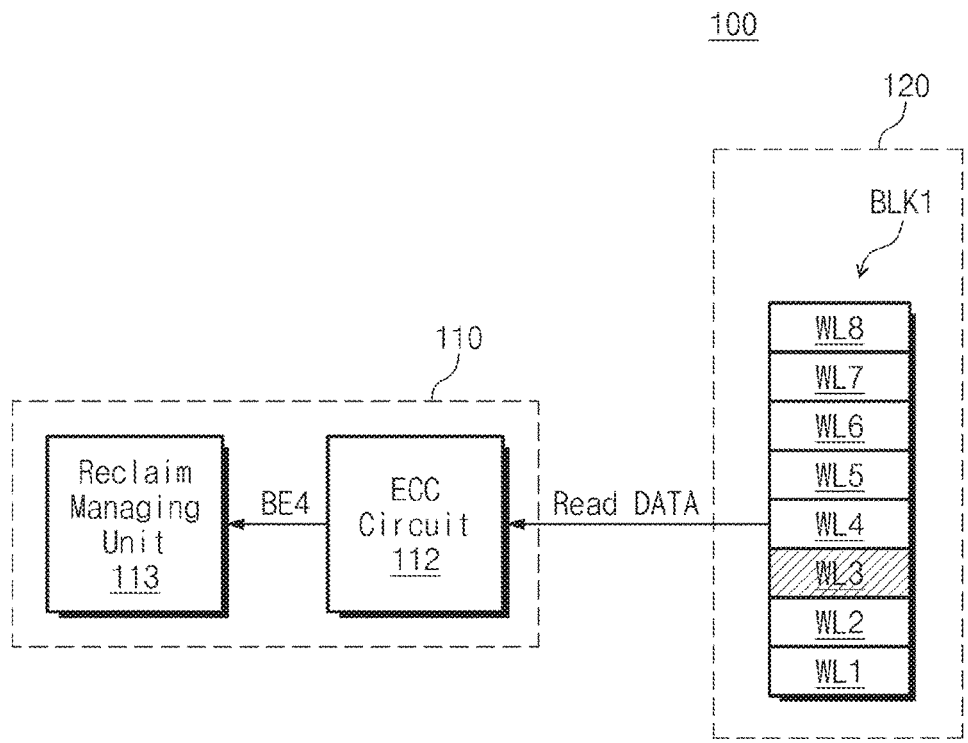
FIG. 14 is a drawing for explaining an operating method of a memory controller in accordance with some other embodiments of the inventive concept.

FIGS. 11 through 13 are drawings for explaining the operating method of FIG. 10. For convenience of description, it is assumed that the third word line WL3 is a word line selected according to a read request of a host and the fifth word line WL5 is a word line selected for a dummy read operation. However, the inventive concept is not limited thereto.

Referring to FIGS. 1, 10 and 11, the memory controller 110 can perform a dummy read operation on the fifth word line WL5. For example, the memory controller 110, as described with reference to FIG. 8, may perform a read operation on the third word line WL3 and estimate the number of error bits with respect to the remaining word lines. A low-order word line among the word lines WL5~WL8 having the estimated number of error bits greater than the reclaim reference value may be the fifth word line WL5. In this case, the memory controller 110 may select the fifth word line WL5 to perform a dummy read operation.

The memory controller 110 may perform a dummy read operation on the selected fifth word line WL5. For example, the memory controller 110 may read data from the fifth word line WL5. The ECC circuit 112 may detect error bits of the read data DATA. As an alternative to that described with reference to FIG. 8, the ECC circuit 112 may not correct error bits of data DATA read from the fifth word line WL5.

The ECC circuit 112 may transmit the detected number BE5 of error bits of the fifth word line WL5 to the reclaim managing unit 113. The reclaim managing unit 113 may compare the detected number BE5 of error bits with the reclaim reference value RC_ref.

In the case that the detected number BE5 of error bits smaller than the reclaim reference value RC_ref, as illustrated in FIG. 12, the memory controller 110 can further perform a dummy read operation on the sixth word line (that is, a high order word line). In the case that the number BE6 of error bits detected from the dummy read operation illustrated in FIG. 12 is smaller than the reclaim reference value RC_ref, the memory controller 110 may further perform a dummy read operation on the seventh or eighth word line WL7 or WL8. In the case that the number BE6 of error bits detected from the dummy read operation illustrated in FIG. 12 is greater than the reclaim reference value RC_ref, the memory controller 110 may select the sixth word line WL6 and high order word lines (that is, the seventh and eighth word lines WL7 and WL8) from the sixth word line WL6 as a word line to be partially read-reclaimed. That is, the memory controller 110 may also select word lines having ELT longer than that of the sixth word line WL6 as a word line to be partially read-reclaimed.

In FIG. 11, in the case that the detected number BE5 of error bits is greater than the reclaim reference value RC_ref, as illustrated in FIG. 13, the memory controller 110 may further perform a dummy read operation on the fourth word line WL4 (that is, a low order word line). In the dummy read operation illustrated in FIG. 13, in the case that the detected number BE4 of error bits is smaller than the reclaim reference value RC_ref, the memory controller 110 can select word lines (fifth through eighth word lines WL5~WL8) from the fourth word line WL4 as a word line to be partially read-reclaimed. The memory controller 110 may also select word lines having ELT longer than that of the fourth word line WL4 as a word line to be partially read-reclaimed.

As described above, the memory controller 110 may perform a dummy read operation on the basis of ELT of each of the word lines. The memory controller 110 may select a part of word lines according to a result of the dummy read operation and perform a partial read reclaim operation on the selected word lines. Thus, a nonvolatile memory system having improved reliability and an operating method thereof are provided.

FIG. 14 is a drawing for explaining an operating method of a memory controller in accordance with some other embodiments of the inventive concept. For brevity of description, various elements unnecessary for describing some other embodiments of the inventive concept and the various elements described above are omitted. Referring to FIGS. 1 and 14, the memory controller 110 may operate on the basis of the operating method described above. In the operating method of the memory controller 110 described with reference to FIGS. 1 through 13, the reclaim reference value RC_ref is a predetermined value. However, as illustrated in FIG. 14, the memory controller 110 may apply different reclaim reference values RC_ref1~RC_ref8 depending on ELT of each of the word lines WL1~WL8.

As described above, as the ELT of the word line increases, reliability of data stored in memory cells connected to the word line is degraded. Accordingly, the memory controller 110 may apply a low reclaim reference value to a word line having a long ELT and apply a high reclaim reference value to a word line having a short ELT. For example, an ELT of the first word line WL1 may be first time T1 and an ELT of the eighth word line WL8 may be eighth time T8. The first time T1 is shorter than the eighth time T8. That is, the first word line WL1 may have reliability higher than that of the eighth word line WL8.

The memory controller 110 may apply a first reclaim reference value RC_ref1 to the first word line WL1 and apply an eighth reclaim reference value RC_ref8 lower than the first reclaim reference value RC_ref1 to the eighth word line WL8. Even though the estimated number (or the detected number of error bits) of error bits of the eighth word line WL8 is smaller than the estimated number (or the detected number of error bits) of error bits of the first word line WL1, the eighth word line WL8 may be selected as a word line to be partially read-reclaimed and the first word line WL1 may not be selected by applying the eighth reclaim reference value RC_ref8 lower than the first reclaim reference value RC_ref1 to the eighth word line WL8 by the memory controller 110. That is, a word line having low reliability may be selected as a word line to be partially read-reclaimed by applying different reclaim reference values depending on an ELT. As a result, an overhead of a partial read reclaim operation may be reduced.

FIG. 15 is a block diagram illustrating a nonvolatile memory system in accordance with some other embodiments of the inventive concept. Referring to FIG. 15, a nonvolatile memory system 200 includes a memory controller 210 and a nonvolatile memory device 220. The memory controller 210 includes a timing managing unit 211, an ECC circuit 212, a reclaim managing unit 213 and a reliability managing unit 214.

The memory controller 210 may transmit an address ADDR, a command CMD and a control signal CTRL to the nonvolatile memory device 220. The memory controller 210 can exchange data with the nonvolatile memory device 220. Since the memory controller 210, the nonvolatile memory device 220, the timing managing unit 211, the ECC circuit 212, and the reclaim managing unit 213 were described with reference to FIG. 1, a detailed description thereof is omitted.

Unlike the memory controller 110 of FIGS. 1 through 14, the memory controller 210 of FIG. 15 further includes the reliability managing unit 214. The reliability managing unit 214 may perform or manage a series of operations for maintaining or improving reliability of data stored in the nonvolatile memory device 220. For example, the reliability managing unit 214 may perform or manage a dummy read operation. The reliability managing unit 214 may count a write request from a host and compare the counting value with a random value to perform a dummy read operation. In a dummy read operation, a random word line may be selected as a word line for the dummy read operation. For example, the reliability managing unit 214 may select a word line having the longest ELT among a plurality of word lines of the first memory block BLK1 as a word line for a dummy read operation. The reliability managing unit 214 may also select the highest order word line of the first memory block BLK1 as a word line for a dummy read operation. However, the inventive concept is not limited thereto. The reliability managing unit 214 may perform the dummy read operation described with reference to FIGS. 10 through 13.

The reliability managing unit 214, in the case that a write request is received from a host as many as the random number of times, may perform a dummy read operation. In exemplary embodiments, the random value may be generated by the reliability managing unit 214. After the dummy read operation is performed, the random value is regenerated and a counting value may be reset.

Figure 16:
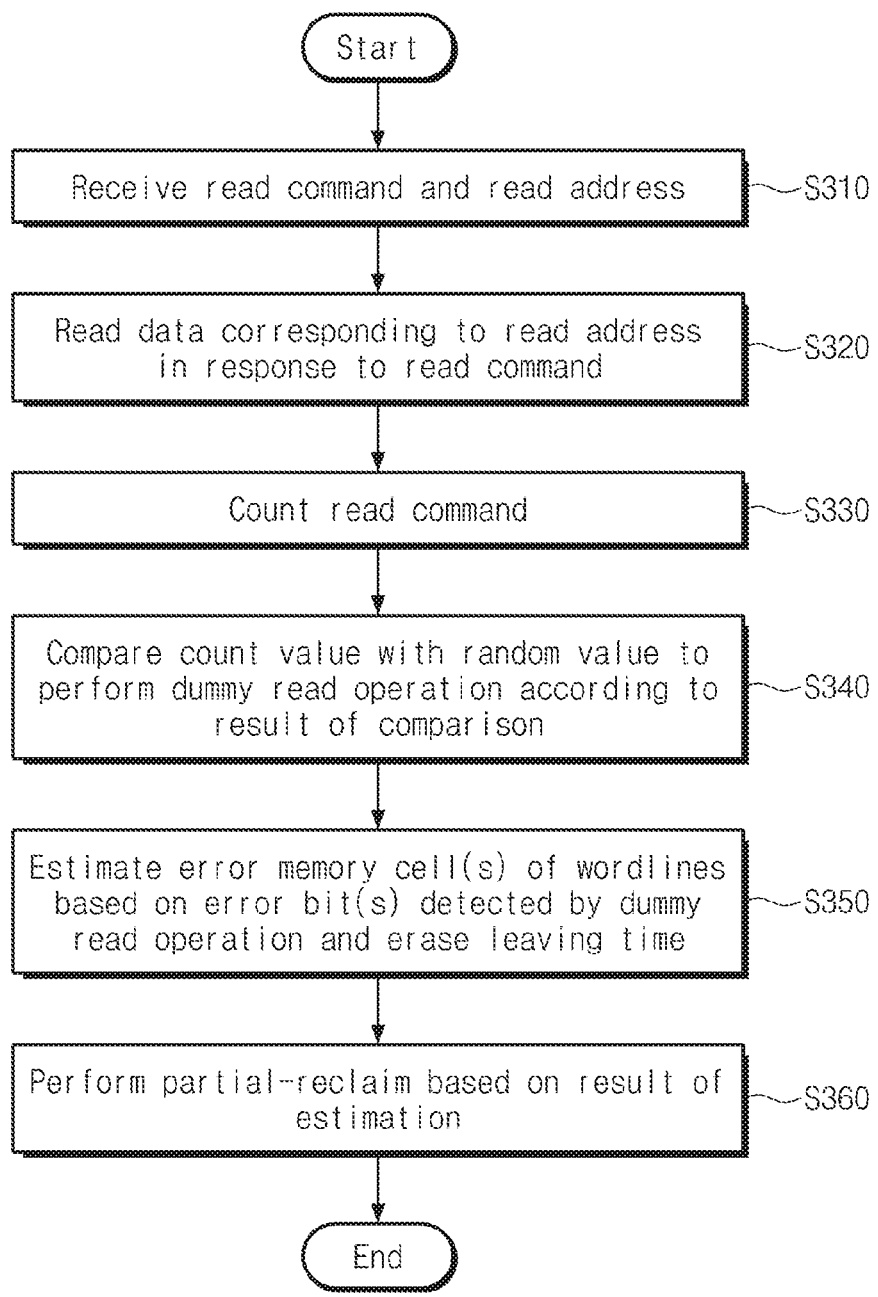
FIG. 16 is a flowchart illustrating an operation of a memory controller of FIG. 15.

FIG. 16 is a flowchart illustrating an operation of a memory controller of FIG. 15. Referring to FIGS. 15 and 16, the memory controller 210 may perform steps S310 and S320. Since the steps S310 and S320 are the same as the steps S110 and S120, a description thereof is omitted.

In a step S330, the memory controller 210 may count a received read command.

In a step S340, the memory controller 210 may compare a counting value with the random value to perform a dummy read operation according to a comparison result. For example, in the case that a counting value with respect to the read command reaches the random value, the memory controller 210 may perform a dummy read operation. The memory controller 210 can select an arbitrary word line among the word lines WL1~WL8 included in the first memory block BLK1. The selected random word line may be a word line having the longest ELT or the highest order word line among the word lines WL1~WL8 included in the first memory block BLK1.

In a step S350, the memory controller 210 may estimate the number of error bits of the word lines on the basis of a result (that is, the number of error bits of the selected arbitrary word line) of the dummy read operation. The step S350 is similar to the step S140 of FIG. 7.

In a step S360, the memory controller 210 may perform a partial read reclaim operation on the basis of a result of estimation.

The nonvolatile memory system 200 described with reference to FIGS. 15 and 16 performs a dummy read operation for a reliability verification when a read request from a host reaches the random number of times. The nonvolatile memory system 200 may perform a partial read reclaim operation based on a result of the dummy read operation.

Figure 17:
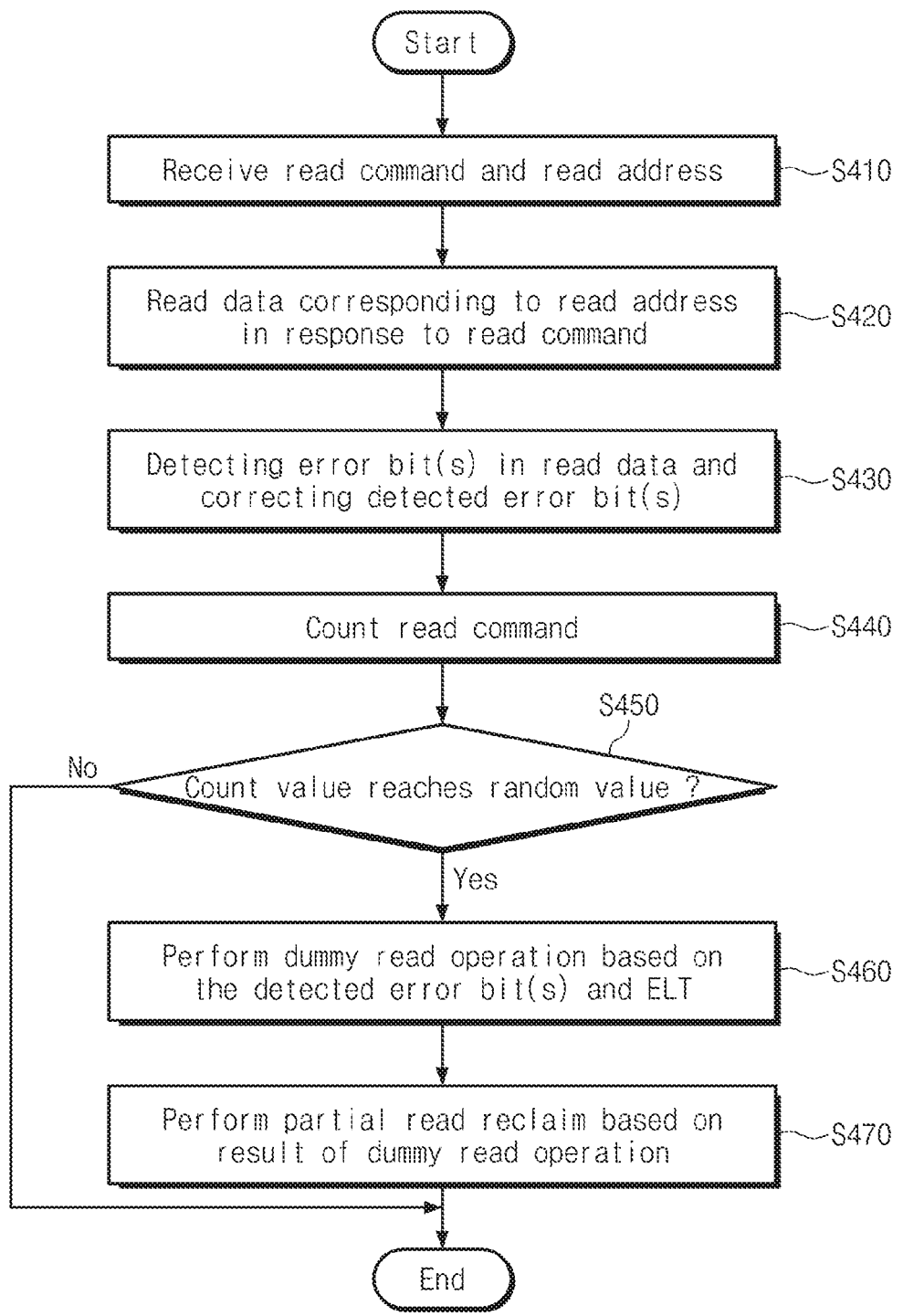
FIG. 17 is a flowchart illustrating an operation of a memory controller of FIG. 15 in accordance with some other embodiments of the inventive concept.

FIG. 17 is a flowchart illustrating an operation of a memory controller of FIG. 15 in accordance with some other embodiments of the inventive concept. Referring to FIGS. 15 and 17, the memory controller 210 can perform steps S410, S420, S430 and S440. Since the steps S410, S420 and S430 are the same as the steps S110, S120 and S130 of FIG. 7 and the step S440 is the same as the step S330 of FIG. 16, a description thereof is omitted.

In a step S450, the memory controller 210 may judge whether a counting value reaches a random value.

In the case that the counting value reaches the random value, in a step S460, the memory controller 210 may perform a dummy read operation on the basis of the detected number of error bits and ELT. In a step S470, the memory controller 210 may perform a partial read reclaim operation on the basis of a result of the dummy read operation. The operations of the steps S460 and S470 may be the read operations described with reference to FIGS. 10 through 13.

According to the embodiment of the inventive concept described with reference to FIG. 17, since a word line for a dummy read operation is selected based on the detected number of error bits and the ELT, the accuracy of reliability verification with respect to each word line of the first memory block BLK1 may be improved. Thus, a nonvolatile memory system having improved reliability is provided.

In the embodiments of the inventive concept described with reference to FIGS. 15 through 17, the memory controller 210 may manage an ELT (erase leaving time) with respect to each word line. Although not illustrated in the drawing, as described with reference to FIG. 14, the memory controller 210 can apply different reclaim reference values to each word line depending on ELT.

For example, the memory controller 210 may compare the number of error bits detected through a dummy read operation with a reclaim reference value of a word line selected for the dummy read operation to judge whether the selected word line is partially read-reclaimed. Thus, reliability with respect to a word line having a relatively long ELT may be improved.

Figure 18:
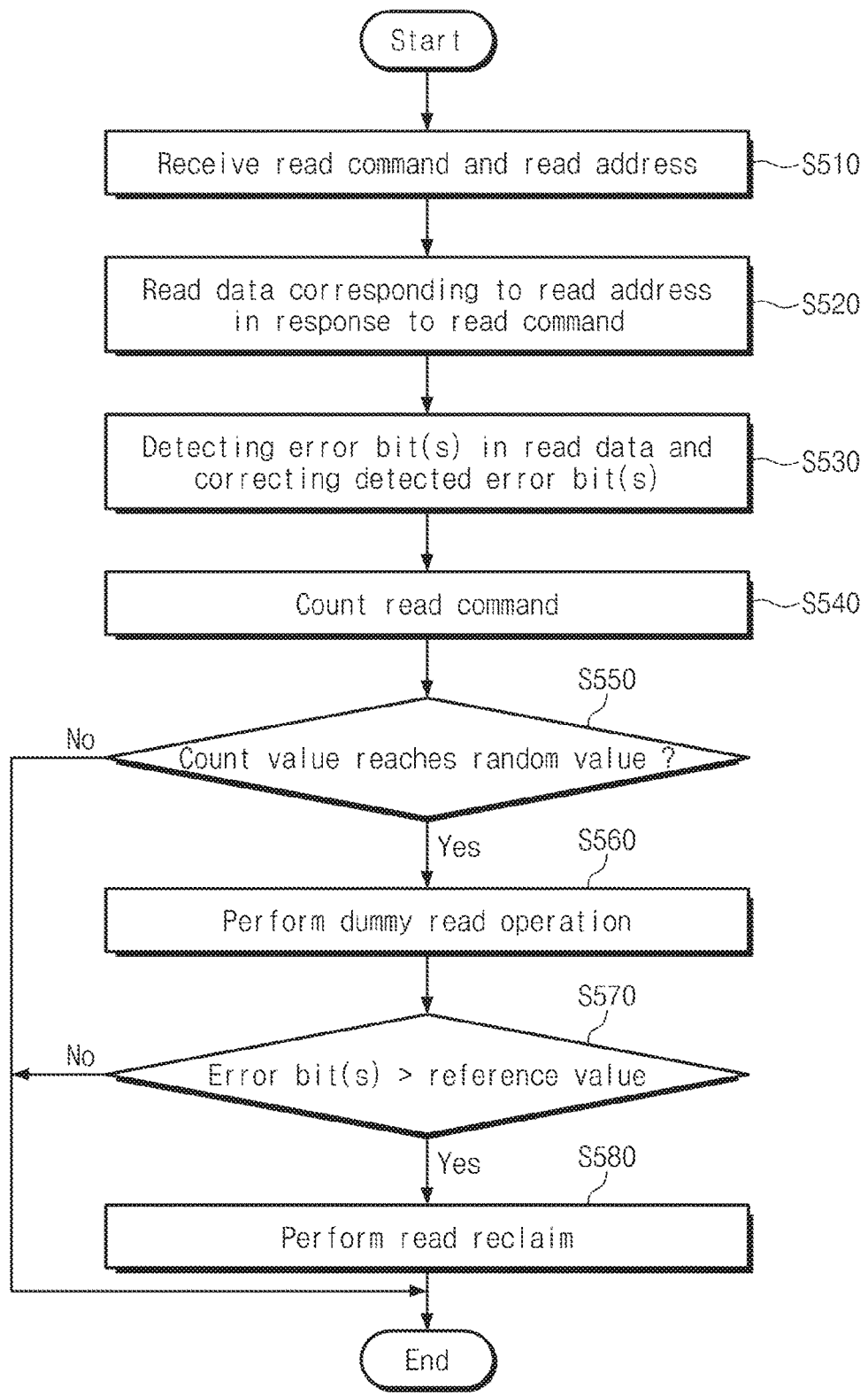
FIG. 18 is a flowchart illustrating an operation of a memory controller of FIG. 15 in accordance with some other embodiments of the inventive concept.

FIG. 18 is a flowchart illustrating an operation of a memory controller of FIG. 15 in accordance with some other embodiments of the inventive concept. Referring to FIGS. 15 and 18, the memory controller 210 may perform steps S510 through S550. Since the steps S510 through S550 are the same as the steps S410 through S450 of FIG. 17, a description thereof is omitted.

According to a judgment result of the step S550, in the case that a counting value reaches the random value, in a step S560, the memory controller 210 may perform a dummy read operation. For example, the memory controller 210 may select a random word line among the word lines WL1~WL8 included in the first memory block BLK1 and perform a dummy read operation on the selected word line. The memory controller 210 can perform a dummy read operation to detect the number of error bits of the selected word line.

In a step S570, the memory controller 210 may compare the number of error bits detected through the dummy read operation with the reclaim reference value. As described above, the memory controller 210 may manage an ELT of each word line. The reclaim reference value may be changed depending on an ELT of a word line selected for a dummy read operation. For example, as an ELT of a word line selected for a dummy read operation becomes long, the reclaim reference value becomes small. That is, since as an ELT becomes long, reliability of memory cells becomes low, the memory controller 210 may lower the reclaim reference value such that memory cells having low reliability are reclaimed.

In the case that the number of error bits detected through the dummy read operation greater than the reclaim reference value, in a step S580, the memory controller 210 can perform a read reclaim operation.

In exemplary embodiments, the read reclaim operation of the step S580 may be performed by a memory block unit. For example, the memory controller 210 may perform a read reclaim operation on a memory block including a word line on which a dummy read operation is performed. That is, in the case that the memory block including a word line on which a dummy read operation is performed is the first memory block BLK1, the memory controller 210 may sequentially read data stored in the first memory block BLK1 and write the read data in a free block.

According to the embodiment of the inventive concept described above, the nonvolatile memory system 200, after a read operation is performed as many as the arbitrary number of times by a request of a host, may perform a dummy read operation to maintain data reliability. The nonvolatile memory system 200 may compare the number of error bits detected through the dummy read operation with the reclaim reference value to perform a read reclaim operation. By controlling the reclaim reference value based on an ELT of a word line on which a dummy read operation is performed, the nonvolatile memory system 200 may prevent reliability degradation of a memory cell or data due to the ELT.

Figure 19:
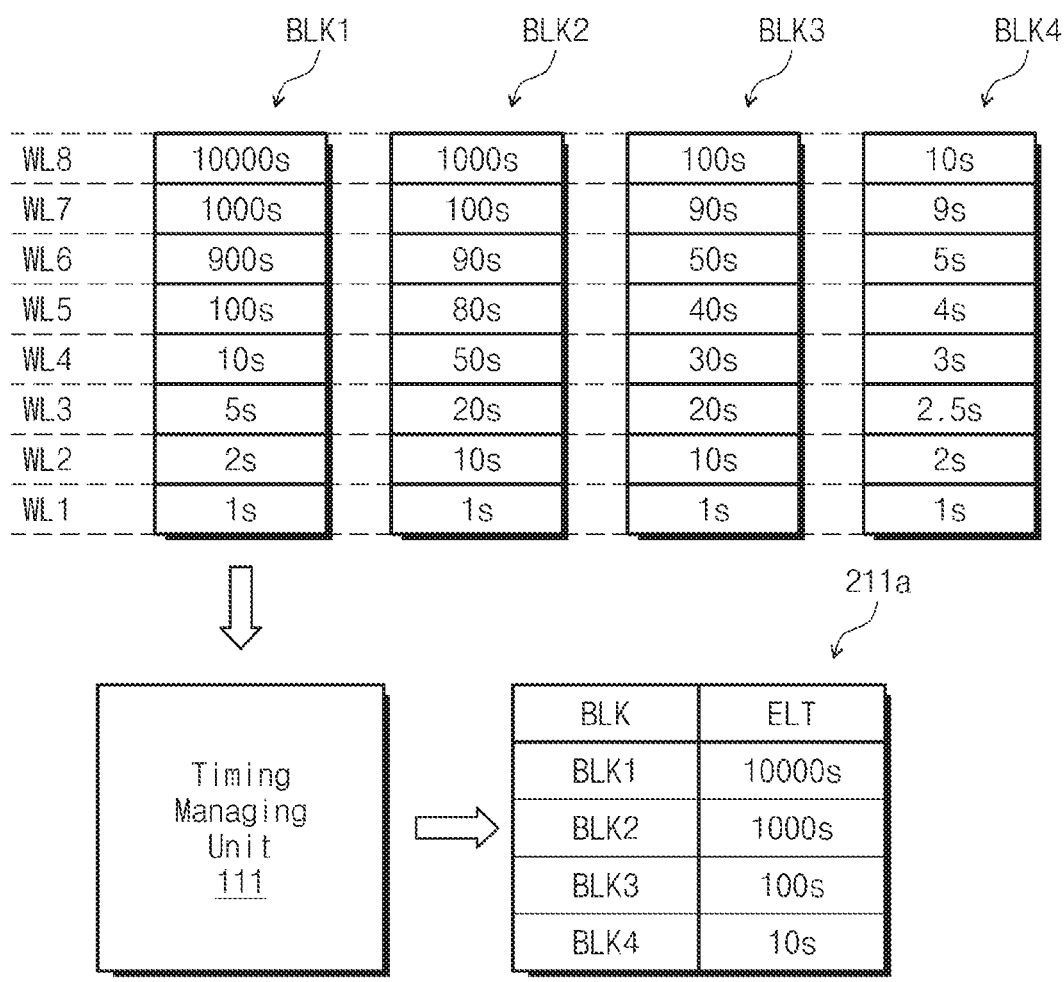
FIG. 19 is a drawing for explaining an operation of a memory controller in accordance with some other embodiments of the inventive concept.

FIG. 19 is a drawing for explaining an operation of a memory controller in accordance with some other embodiments of the inventive concept. In the embodiments of the inventive concept described with reference to FIGS. 1 through 18, the ELT was managed by a timing managing unit by a word line unit. However, unlike that, in the embodiment of FIG. 19, the ELT may be managed by a memory block unit.

Referring to FIGS. 15 and 19, the memory controller 210 can manage an ELT by a memory block unit. For example, the nonvolatile memory device 220 may include first through fourth memory blocks BLK1~BLK4. The first through fourth memory blocks BLK1~BLK4 may have a three-dimensional structure described with reference to FIG. 4.

After erasing the first through fourth memory blocks BLK1~BLK4, the memory controller 210 can sequentially perform a program operation on from a low order word line to a high order word line by a word line unit. An ELT of word lines of the first through fourth memory blocks BLK1~BLK4 may be such as illustrated in FIG. 19. For example, ELTs of first through eighth word lines WL1~WL8 of the first memory block BLK1 may be 1 s, 2 s, 5 s, 10 s, 100 s, 900 s, 1000 s and 10000 s. The timing managing unit 211 of the memory controller 210 can manage ELT of the first memory block BLK1 as 10000 s. That is, the memory controller 210 manages the longest ELT among ELTs of word lines of the first memory block BLK1 as an ELT of the first memory block BLK1. Similarly, the memory controller 210 manages the longest ELT among ELTs of word lines of the second through fourth memory block BLK2~BLK4 as an ELT of each of the second through fourth memory block BLK2~BLK4.

In the embodiment illustrated in FIG. 19, the highest order word line (i.e., the eighth word line WL8) of the first through fourth memory blocks BLK1~BLK4 has the longest ELT. However, the inventive concept is not limited thereto and a word line having the longest ELT may be changed depending on a program order.

As illustrated in FIG. 19, in the case that the memory controller 210 manages an ELT by a memory block unit, the memory controller 210 can control the reclaim reference value based on an ELT of a memory block including a word line selected for a dummy read operation. Since an operation of changing the reclaim reference value based on an ELT was described in the aforementioned embodiments, a detailed description thereof is omitted. The memory controller 210 can perform a read reclaim operation according to a result of the dummy read operation.

According to the embodiments of the inventive concept described above, the memory controller can manage an ELT of the nonvolatile memory device (or a word line or a memory block). The memory controller can perform a partial read reclaim operation with respect to a part of word lines of the memory block on the basis of the ELT. The memory controller can control a reclaim reference value on the ELT and select a word line or a memory block to be reclaimed on the basis of the controlled reclaim reference value.

The embodiments of the inventive concept described above are illustrative embodiments for describing technical features of the inventive concept in detail and the inventive concept is not limited thereto. For example, in the embodiments of the inventive concept described above, read, dummy read, partial read reclaim and read reclaim operations according to a request of a host were described based on the first memory block BLK1 but the memory controller of the inventive concept can perform read, dummy read, partial read reclaim and read reclaim operations according to a request of a host with respect to other memory blocks besides the first memory block BLK1.

Figures (for example, erase leaving time, a word line number, a memory block number, etc.) used in the embodiments of the inventive concept described above are illustrative and the inventive concept is not limited thereto. The technical features of the inventive concept may be combined with one another.

In a dummy read operation of the memory controller, the memory controller, instead of detecting an error bit of the read data, detects the number of on-cells of a selected word line (that is, a word line selected for a dummy read voltage) using a reference voltage and can select a word line to be partially read-reclaimed on the basis of the detected number of on-cells. The memory controller can detect a memory block to be read-reclaimed on the basis of the detected number of on-cells.

In the embodiments of the inventive concept described above, a read reclaim operation based on an ELT was described but the inventive concept is not limited thereto. For example, the memory controller can manage a variety of information (e.g., temperature, program time, the number of times of a read operation, the number of times of a write operation, a program-erase cycle, etc.) of the nonvolatile memory device. The variety of information being managed by the memory controller may be factors affecting reliability of data stored n the nonvolatile memory device. The memory controller can perform the operation described with reference to FIGS. 1 through 19 based on not only an ELT but also the variety of information.

Figure 20:
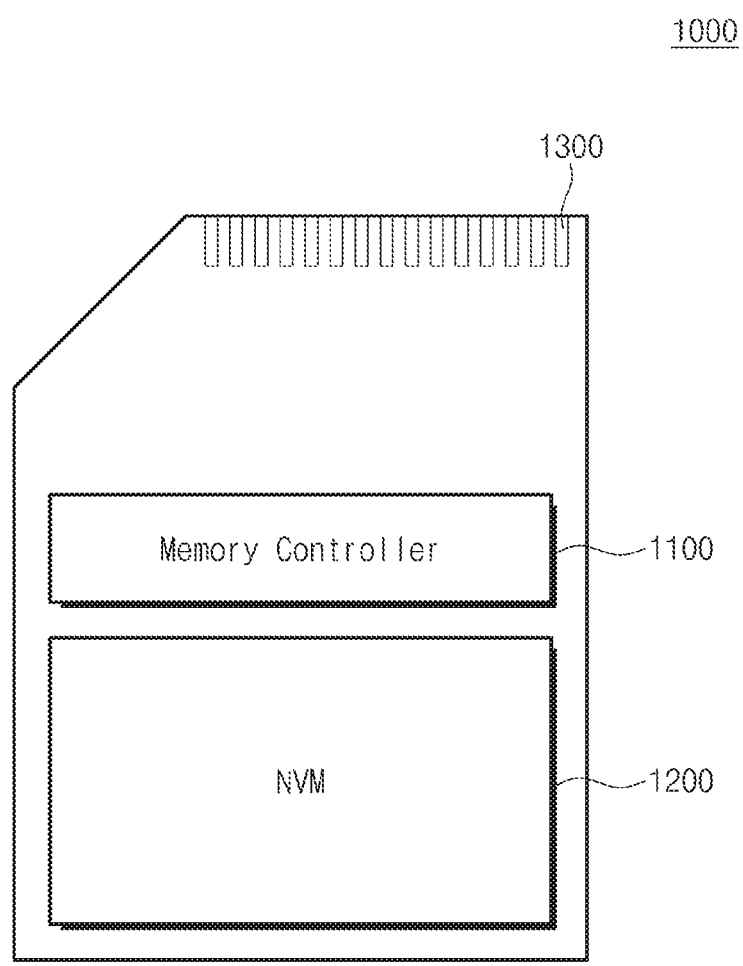
FIG. 20 is a block diagram illustrating a memory card system including the nonvolatile memory system in accordance with some embodiments of the inventive concept.

FIG. 20 is a block diagram illustrating a memory card system including the nonvolatile memory system in accordance with some embodiments of the inventive concept. Referring to FIG. 20, a memory card system 1000 includes a controller 1100 a nonvolatile memory 1200, and a connector 1300.

The controller 1100 is connected to the nonvolatile memory 1200. The controller 1100 is configured to access the nonvolatile memory 1200. For example, the controller 1200 is configured to control read, write, erase and background operations of the nonvolatile memory 1100. The background operation includes operations such as wear level management, garbage collection, etc. The controller 1100 can perform a garbage collection on the basis of the method described with reference to FIGS. 1 through 14.

The controller 1100 is configured to provide an interface between the nonvolatile memory 1200 and a host. The controller 1100 is configured to drive firmware for controlling the nonvolatile memory 1200.

The controller 1100 may include constituent elements such as a RAM, a processing unit, a host interface, a memory interface, an error correction unit, etc.

The controller 1100 can communicate with an external device through the connector 1300. The controller 1100 can communicate with an external device (for example, the host) through a specific communication regulation. The controller 1100 is configured to communicate with an external device through at least one of various communication regulations such as a USB (universal serial bus), a MMC (multimedia card), a eMMC (embedded MMC), a PCI (peripheral component interconnection), a PCI-E (PCI-express), an ATA (advanced technology attachment), a serial-ATA, a parallel-ATA, a SCSI (small computer small interface), an ESDI (enhanced small disk interface), an IDE (integrated drive electronics), a Firewire, a UFS (universal flash storage), a NVMe (nonvolatile memory-express), etc.

The nonvolatile memory 1200 may be embodied by various nonvolatile memory devices such as an electrically erasable programmable read-only memory (EEPROM), a NAND flash memory, a NOR flash memory, a phase change RAM (PRAM), a ReRAM (resistive RAM), a ferroelectric RAM (FeRAM), a STT-MRAM (spin-torque magnetic RAM), etc.

The controller 1100 and the nonvolatile memory 1200 can be integrated in one semiconductor device. The controller 1100 and the nonvolatile memory 1200 can be integrated in one semiconductor device to define an SSD (solid state drive). The controller 1100 and the nonvolatile memory 1200 can be integrated in one semiconductor device to define a memory card. For example, the controller 1100 and the nonvolatile memory 1200 can be integrated in one semiconductor device to define a memory card such as a personal computer memory card international association (PCMCIA) card, a compact flash (CF) card, a smart media card (SM, SMC), a memory stick, a multimedia card (MMC, RS-MMC, MMCmicro), a SD card (SD, miniSD, microSD, SDHC), a universal flash memory device (UFS), etc.

The nonvolatile memory 1200 or the memory card system 1000 may be mounted using various types of packages such as such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

The nonvolatile memory system 1000 may operate based on the operating method described with reference to FIGS. 1 through 20.

Figure 21:
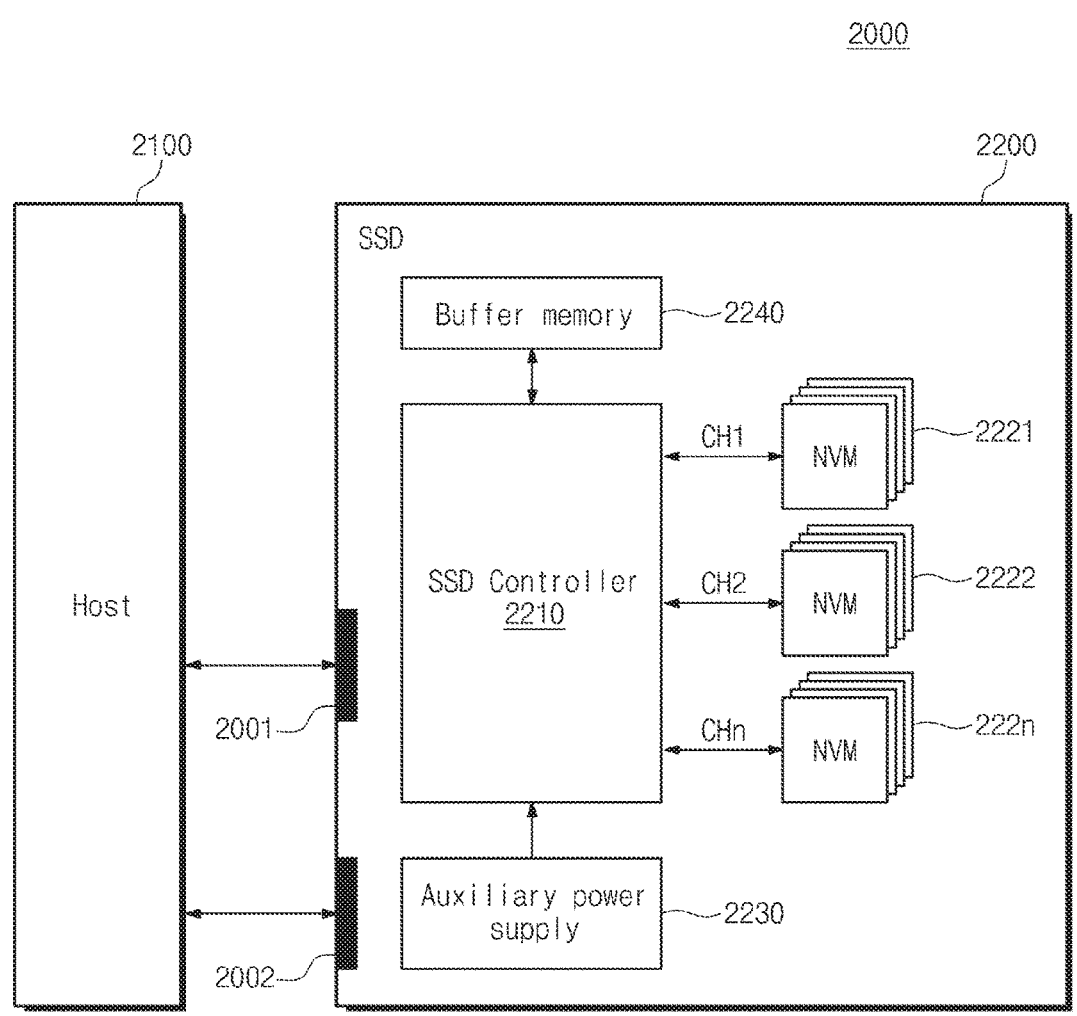
FIG. 21 is a block diagram illustrating an SSD (solid state drive) including the nonvolatile memory system in accordance with some embodiments of the inventive concept.

FIG. 21 is a block diagram illustrating an SSD (solid state drive) including the nonvolatile memory system in accordance with some embodiments of the inventive concept. Referring to FIG. 21, an SSD system 2000 includes a host 2100 and an SSD 2200. The SSD 2200 exchanges a signal SIG with the host 2100 through a signal connector 2001 and receives power PWR through a power connector 2002. The SSD 2200 includes a SSD controller 2210, a plurality of flash memories 2221~222n, an auxiliary power supply 2230 and a buffer memory 2240.

The SSD controller 2210 can control the flash memories 2221~222n in response to a signal SIG received from the host 2100. The SSD controller 2210 can manage an ELT (erase leaving time) of the flash memories 2221~222n and may operate based on the operating method described with reference to FIGS. 1 through 20.

The auxiliary power supply 2230 is connected to the host 2100 through the power connector 2002. The auxiliary power supply 2230 is inputted with power from the host 2100 to be charged. In the case that a power supply from the host 2100 is not smooth, the auxiliary power supply 2230 may provide power of the SSD system. The auxiliary power supply 2230 may be located inside the SSD 2200 or outside the SSD 2200. For example, the auxiliary power supply 2230 may be located on a main board to provide auxiliary power to the SSD 2200.

The buffer memory 2240 operates as a buffer memory of the SSD 2200. For example, the buffer memory 2240 can temporarily store data received from the host 2100, data received from the flash memories 2221~222n or meta data (for example, mapping table) of the flash memories 2221~222n. The buffer memory 2240 may include volatile memories such as DRAM, SDRAM, DDR SDRAM, LPDDR SDRAM, SRAM, etc. or nonvolatile memories such as FRAM, ReRAM, STT-MRAM, PRAM, etc.

Figure 22:
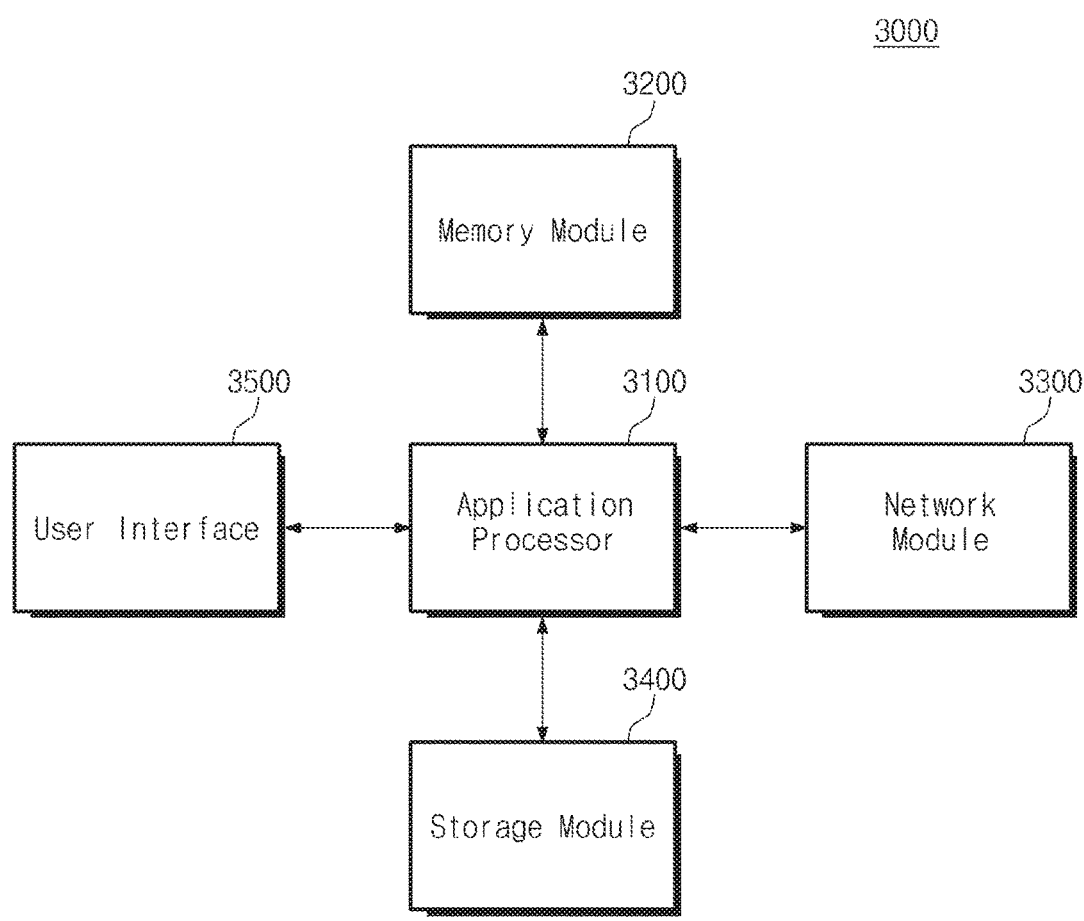
FIG. 22 is a block diagram illustrating a user system including the nonvolatile memory system in accordance with some embodiments of the inventive concept.

FIG. 22 is a block diagram illustrating a user system including the nonvolatile memory system in accordance with some embodiments of the inventive concept. Referring to FIG. 22, a user system 3000 includes an application processor 3100, a memory module 3200, a network module 3300, a storage module 3400 and a user interface 3500.

The application processor 3100 can drive constituent elements and an operating system (OS) that are included in the user system 3000. The application processor 3100 may include controllers controlling the constituent elements included in the user system 3000, interfaces, graphic engine, etc. The application processor 3100 may be provided as a SoC (system-on-chip).

The memory module 3200 may operate as a main memory, an operation memory, a buffer memory or a cache memory of the user system 3000. The memory module 3200 may include a volatile random access memory such as DRAM, SDRAM, DDR SDRAM, DDR2 SDRAM, DDR3 SDRAM, LPDDR SDRAM, LPDDR3 SDRAM, etc. and a nonvolatile random access memory such as PRAM, ReRAM, MRAM, FRAM, etc. The memory module 3200 may be packaged with the application processor 3100 in a POP manner.

The network module 3300 can communicate with external devices. The network module 3300 can support a wireless communication such as a CDMA (code division multiple access), a GSM (global system for mobile communication), a WCDMA (wideband CDMA), a CDMA-2000, a TDMA (time division multiple access), a LTE (long term evolution), a Wimax, a WLAN, a UWB, a Bluetooth, a WI-DI, etc. The network module 3300 may be included in the application processor 3100.

The storage module 3400 can store data. For example, the storage module 3400 can store data received from the application processor 3100. The storage module 3400 can transmit data stored in the storage module 3400 to the application processor 3100. The storage module 3400 may be embodied by a nonvolatile semiconductor memory device such as a PRAM (phase-change RAM), a MRAM (magnetic RAM), a RRAM (resistive RAM), a NAND flash, a NOR flash, a NAND flash of a three-dimensional structure.

The storage module 3400 may operate based on the operating method described with reference to FIGS. 1 through 19.

The user interface 3500 may include interfaces that input data or commands to the application processor 3100 or output data to an external device. The user interface 3500 may include user input interfaces such as a keyboard, a keypad, a button, a touch panel, a touch screen, a touch pad, a touch ball, a camera, a mike, a gyroscope sensor, a vibration sensor, a piezoelectric device, etc. The user interface 3500 may include user output interfaces such as a liquid crystal display (LCD), an organic light emitting diode (OLED) display, an active matrix OLED (AMOLED) display, a LED, a speaker, a motor, etc.

According to the embodiments of the inventive concept described above, the nonvolatile memory system can manage an ELT of memory cells by a memory block unit, a word line unit, or a page unit. The nonvolatile memory system can perform a read reclaim operation on the basis of the ELT. Thus, a nonvolatile memory system having improved reliability may be provided.

According to the embodiments of the inventive concept, since the nonvolatile memory system selects a word line to be partially read-reclaimed among a plurality of word lines of a memory block on the basis of an ELT, an overhead with respect or a read reclaim operation is reduced. Thus, a nonvolatile memory system having improved reliability may be provided.

According to the embodiments of the inventive concept, a nonvolatile memory system can perform a partial read reclaim operation or a read reclaim operation on the basis of an ELT. Thus, a nonvolatile memory system having improved performance and reliability and an operating method thereof are provided.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. An operating method of a nonvolatile memory system including a nonvolatile memory device and a memory controller managing the nonvolatile memory device, the operating method comprising:
   receiving a read command and a read address from an external device;
   reading read data stored in memory cells connected to a selected word line of a selected memory block corresponding to the read address in response to the read command;
   detecting and correcting error bits of the read data;
   estimating a number of error bits of unselected word lines based upon erase leaving times (ELTs) of memory cells connected to the unselected word lines of the selected memory block and the detected error bits; and
   performing a read-reclaim operation on at least one word line among the selected word line and the unselected word lines based upon the estimated number of error bits.

2. The operating method of claim 1, wherein the ELTs are defined by an elapsed time from a time point when each of memory cells of the selected word line and the unselected word lines is erased to a time point when each of the memory cells is programmed after it is erased.

3. The operating method of claim 1, wherein performing the read-reclaim operation on the at least one word line comprises:
   comparing the estimated number of error bits with a reclaim reference value;
   selecting the at least one word line according to a comparison result; and
   moving data stored in memory cells of the at least one word line to a free memory block of the nonvolatile memory device.

4. The operating method of claim 3, wherein comparing the estimated number of error bits with the reclaim reference value comprises comparing different reclaim reference values depending on an ELT of each of the selected word line and the unselected word lines with the estimated number of error bits of each of the selected word line and the unselected word lines with respect to each of the selected word line and the unselected word lines, respectively.

5. The operating method of claim 4, wherein as the ELT increases, the reclaim reference value is lowered.

6. The operating method of claim 3, wherein selecting the at least one word line according to the comparison result comprises selecting the at least one word line where the estimated number of error bits is greater than the reclaim reference value.

7. The operating method of claim 3, wherein moving data stored in memory cells of the selected word lines to a free memory block of the nonvolatile memory device comprises:
   reading data stored in memory cells of the at least one word line;
   correcting an error of the data read from the memory cells of the at least one word line; and programming the error-corrected data in the free memory block.

8. The operating method of claim 1, wherein performing the read-reclaim operation on the at least one word line comprises:
selecting one word line among the unselected word lines based upon the estimated number of error bits;
performing a dummy read operation on memory cells of the selected one word line;
selecting the at least one word line among the selected word line and the unselected word lines based upon a result of the dummy read operation; and
performing the read-reclaim operation on the at least one word line.

9. The operating method of claim 8, further comprising transmitting error-corrected read data to the external device, wherein data read from the any one word line by the dummy read operation is not transmitted to the external device.

10. The operating method of claim 1, wherein the nonvolatile memory device comprises a three-dimensional memory array.

11. The operating method of claim 10, wherein the three-dimensional memory array comprises a plurality of memory cells and each of the memory cells comprises a charge trap layer.

12. An operating method of a nonvolatile memory system including a nonvolatile memory device and a memory controller managing the nonvolatile memory device comprising:
receiving a read command and a read address from an external device;
reading read data stored in memory cells connected to a selected word line of a selected memory block corresponding to the read address in response to the read command;
detecting and correcting an error bit of the read data;
counting the read command;
when the counting value reaches a random value, performing a dummy read operation on any one word line among unselected word lines of the selected memory block to detect a number of error bits of the any one word line; and
comparing a reclaim reference value depending on an erase leaving time (ELT) of memory cells of the any one word line or the selected memory block with the detected number of error bits and performing a read-reclaim operation on the selected memory block according to the comparison result.

13. The operating method of claim 12, wherein the ELT indicates elapsed time from a time point when the memory cells are erased to a time point when the memory cells are programmed after they are erased; and wherein the ELT of the memory block is a longest time among the ELTs of the memory cells.

14. The operating method of claim 12, wherein as the ELT of the memory block or any one word line increases, the reclaim reference value is lowered.

15. The operating method of claim 12 further comprising resetting the counting value and regenerating the random value when the counting value reaches the random value.

16. An operating method of a nonvolatile memory system including a nonvolatile memory device having a plurality of memory blocks and a memory controller managing an erase leaving time (ELT) of each of the plurality of memory blocks, the operating method comprising:
reading data from a selected memory block of the plurality of memory blocks;
detecting an error bit of read data;
comparing a number of the error bit and a reclaim reference value that controlled based on the ELT of the selected memory block; and
performing a read-reclaim operation on the memory block according to a result of the comparison.

17. The operating method of claim 16, wherein the ELT of the selected memory block is defined by an elapsed time from a time point when each of memory cells of the selected memory block is erased to a time point when each of the memory cells is recently programmed after it is erased.

18. The operating method of claim 16, wherein as the ELT of the selected memory block increases, the reclaim reference value is lowered.

19. The operating method of claim 16, wherein performing a read-reclaim operation on the memory block according to a result of the comparison comprises performing the read-reclaim operation on the memory block when the number of the error bit is greater than the reclaim reference value.

20. The operating method of claim 16, wherein the nonvolatile memory device comprises a three-dimensional memory array and each of the memory cells comprises a charge trap layer.

* * * * *